US 6,717,151 B2

(12) United States Patent
Tashiro et al.

(10) Patent No.: US 6,717,151 B2
(45) Date of Patent: Apr. 6, 2004

(54) IMAGE PICKUP APPARATUS

(75) Inventors: Kazuaki Tashiro, Kanagawa (JP);
Noriyuki Kaifu, Tokyo (JP);
Tetsunobu Kochi, Kanagawa (JP);
Osamu Yuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/899,184

(22) Filed: Jul. 6, 2001

(65) Prior Publication Data
US 2002/0017611 A1 Feb. 14, 2002

(30) Foreign Application Priority Data
Jul. 10, 2000 (JP) .......................... 2000-208306
Jul. 11, 2000 (JP) .......................... 2000-210066

(51) Int. Cl.[7] .................................. G01T 1/20
(52) U.S. Cl. ........................ 250/370.11; 250/208.1; 250/370.08
(58) Field of Search ................. 250/208.1, 370.1, 250/370.8, 370.11

(56) References Cited

U.S. PATENT DOCUMENTS

| | | | |
|---|---|---|---|
| 4,323,925 A | 4/1982 | Abell et al. ................. 358/213 |
| 5,187,581 A | 2/1993 | Kamatani ................. 358/213.11 |
| 5,315,101 A | 5/1994 | Hughes et al. ................. 250/208.1 |
| 5,336,879 A | 8/1994 | Sauer ................. 250/208.1 |
| 5,382,977 A | 1/1995 | Kozlowski et al. ......... 348/300 |
| 5,428,237 A | 6/1995 | Yuzurihara et al. ......... 257/349 |
| 5,464,984 A | 11/1995 | Cox et al. ............. 250/370.11 |
| 5,591,963 A | 1/1997 | Takeda et al. ............ 250/214.1 |
| 5,612,230 A | 3/1997 | Yuzurihara et al. ............ 437/21 |
| 5,773,832 A | * 6/1998 | Sayed et al. ............ 250/370.09 |
| 5,812,191 A | 9/1998 | Orava et al. ................. 348/308 |
| 5,835,045 A | 11/1998 | Ogawa et al. ............. 341/155 |
| 5,841,685 A | 11/1998 | Kochi ........................ 364/807 |
| 5,847,669 A | 12/1998 | Kochi ........................ 341/172 |
| 5,903,043 A | 5/1999 | Ichikawa et al. ........... 257/532 |
| 5,912,942 A | * 6/1999 | Schick et al. .............. 378/98.8 |
| 6,005,911 A | 12/1999 | Cheung ........................ 378/37 |
| 6,035,013 A | * 3/2000 | Orava et al. .................. 378/37 |
| 6,075,256 A | 6/2000 | Kaifu et al. .................. 257/53 |
| 6,080,997 A | 6/2000 | Tashiro et al. ................ 257/28 |
| 6,127,998 A | * 10/2000 | Ichikawa et al. ........... 345/100 |
| 6,166,583 A | 12/2000 | Kochi et al. ................. 327/407 |
| 6,353,229 B1 | * 3/2002 | Polischuk et al. ..... 250/370.14 |

FOREIGN PATENT DOCUMENTS

| | | |
|---|---|---|
| EP | 0 714 632 | 6/1996 |
| JP | 5-218814 | 8/1993 |
| JP | 9-223948 | 8/1997 |
| WO | WO99 31874 A | 6/1999 |

OTHER PUBLICATIONS

Patent Abstracts of Japan vol. 008, No. 039 (E–228), Feb. 21, 1984; of JP 58 197769 A Nov. 17, 1983 *Abstract Only*.

* cited by examiner

Primary Examiner—Constantine Hannaher
Assistant Examiner—Timothy Moran
(74) Attorney, Agent, or Firm—Fitzpatrick, Cella, Harper & Scinto

(57) ABSTRACT

This invention provides a large image pickup apparatus for, e.g., X-rays that can provide a seamless image by using a plurality of single-crystal silicon image pickup elements. More specifically, the image pickup apparatus includes an image pickup region where a plurality of pixels which include photoelectric conversion units are arranged to pick up an object image by dividing the object image into a plurality of regions, and a scan circuit (501, 507) arranged between the plurality of photoelectric conversion units in the region to commonly process the plurality of pixels and/or signals from the plurality of pixels.

46 Claims, 25 Drawing Sheets

DYNAMIC TYPE

EDGE PORTION OF
IMAGE PICKUP ELEMENT

IMAGE PICKUP APPARATUS

BACKGROUND OF THE INVENTION

1. Field of the Invention

The present invention relates to an image pickup apparatus for picking up an object image.

2. Related Background Art

Digitization has being progressed in various medical fields. Also in the X-ray diagnostic field, two-dimensional image pickup apparatuses have been developed to digitize images. Large image pickup apparatuses 43 cm in size at maximum are provided for mammography and chest radiography.

A large X-ray image pickup apparatus is realized by bonding, like tiles, four sensor panels using an amorphous silicon semiconductor formed on a glass substrate which is easy to increase its size. This adopts a technique for forming and using a large substrate for amorphous silicon semiconductor devices (large substrate, technique of forming elements on the substrate, and the like) which has already been established for LCDs (Liquid Crystal Displays). An example of this technique is disclosed in U.S. Pat. No. 5,315,101. FIG. 1 shows a large active array matrix disclosed in this reference. Referring to FIG. 1, this active array matrix comprises substrates 1901, pixels 1902, connection leads 1903, and common terminals 1904.

A large X-ray image pickup apparatus is manufactured by using a plurality of single-crystal image pickup elements (silicon or the like). Examples of this technique are disclosed in U.S. Pat. Nos. 4,323,925 and 6,005,911. Examples of single-crystal image pickup elements are CCD image pickup elements, MOS image pickup elements, and CMOS image pickup elements. Each image pickup element has performance which satisfactorily copes with an X-ray moving picture.

FIG. 2 shows an image sensor disclosed in U.S. Pat. No. 4,323,925. Referring to FIG. 2, an image 2003 of an object 2001 is formed on a surface 2004 via a lens 2002. Successive optical sub-images 2005 are reduced by tapered FOPs (Fiber Optic Plates) 2006 and incident on image input surfaces 2007. Image sensor modules 2008 have non-image pickup peripheral regions 2009 to which lead lines 2010 can be connected.

The prior art shown in FIG. 1 suffers the following problems.

Only a maximum of four (2×2) sensor panels can be used to form one image because external terminals are connected to the peripheral portion to externally connect a driving circuit.

In addition, the scale of a signal processing circuit mountable on an image pickup element is restricted to allow a pixel to have only a pixel selection switch. Signal processing circuits (driver, amplifier, and the like) are externally connected.

Amorphous silicon, which is not good in semiconductor characteristics with respect to high-speed operation, is difficult to form a large image pickup apparatus which copes with a moving picture. An amorphous silicon image pickup element, which is lower in sensitivity than a single-crystal silicon image pickup element, is difficult to cope with an X-ray moving picture which requires high sensitivity.

The prior art shown in FIG. 2 has the following problems.

Each image pickup element is small (wafer size is 8" at maximum by the current technique), so that 2×2 or more image pickup elements are required.

In a simple large image pickup apparatus using many single-crystal image pickup elements, a dead space is inevitably formed at a bonding portion between respective image pickup elements (regions for arranging peripheral circuits such as a shift register, amplifier, and the like, external terminals for exchanging external signals and power, and a protection circuit are necessary separately from a pixel region). The dead space appears as a line defect, thereby degrading the image quality. To prevent this, a tapered FOP (Fiber Optic Plate) is used to guide light from a scintillator to an image pickup element while detouring the dead space. However, extra FOPs increase the manufacturing cost. Especially a tapered FOP is very expensive.

Light from the scintillator is difficult to enter the tapered FOP depending on the taper angle. The output light quantity decreases, and the sensitivities of image pickup elements lower, thereby decreasing the sensitivity of the overall apparatus.

SUMMARY OF THE INVENTION

It is an object of the present invention to provide an image pickup apparatus having an optimal circuit arrangement.

To achieve the above object, according to an aspect of the present invention, there is provided an image pickup apparatus comprising an image pickup region where a plurality of pixels which include photoelectric conversion units are arranged to pick up an object image by dividing the object image into a plurality of regions, and a scan circuit arranged between the plurality of photoelectric conversion units in said image pickup region to commonly process the plurality of pixels or/and signals from the plurality of pixels.

According to another aspect of the present invention, there is provided an image pickup apparatus comprising an image pickup region where a plurality of pixels which include photoelectric conversion units are arranged to pick up an object image by dividing the object image into a plurality of regions, and a common processing circuit arranged between the plurality of photoelectric conversion units in the image pickup region to selectively transfer, to a horizontal output line, signals from a vertical output line to which signals from a plurality of pixels in a vertical direction are read.

According to still another aspect of the present invention, there is provided an image pickup apparatus for dividing an object image into a plurality of regions to form one image, wherein external terminals which are connected to a wiring line sandwiched between boundary sides of first and second regions and are arranged in the first region, are not at the same positions in a direction along the boundary sides as external terminals which are connected to another wiring line sandwiched between the boundary sides and are arranged in the second region.

The above and other objects and features of the present invention will be apparent from the following description in conjunction with the accompanying drawings.

DETAILED DESCRIPTION OF THE PREFERRED EMBODIMENTS

Items common to the following embodiments of the present invention will be described in detail with reference to FIGS. 3 to 8.

Figure 1:
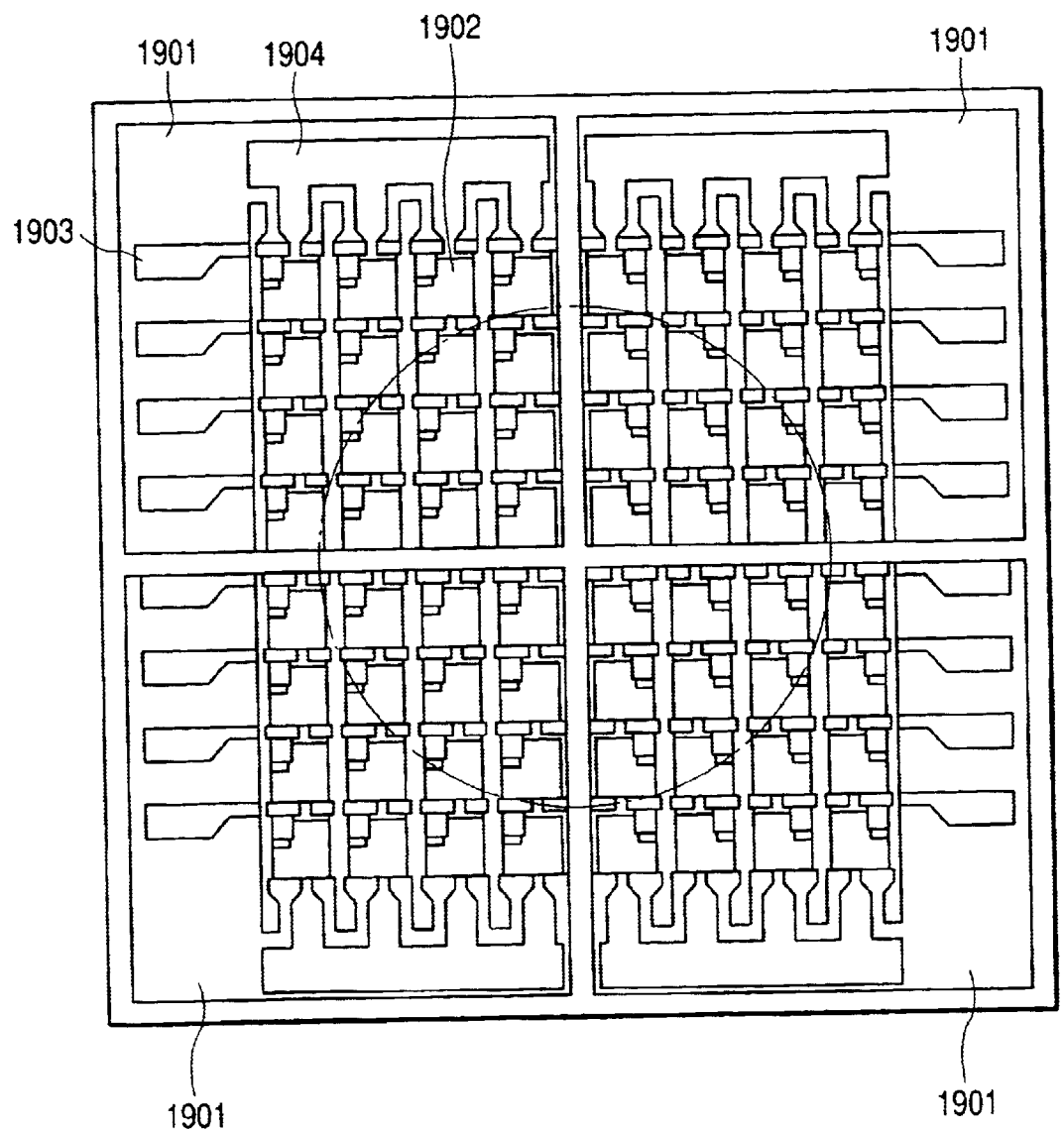
FIG. 1 is a plan view showing prior art 1.
Figure 2:
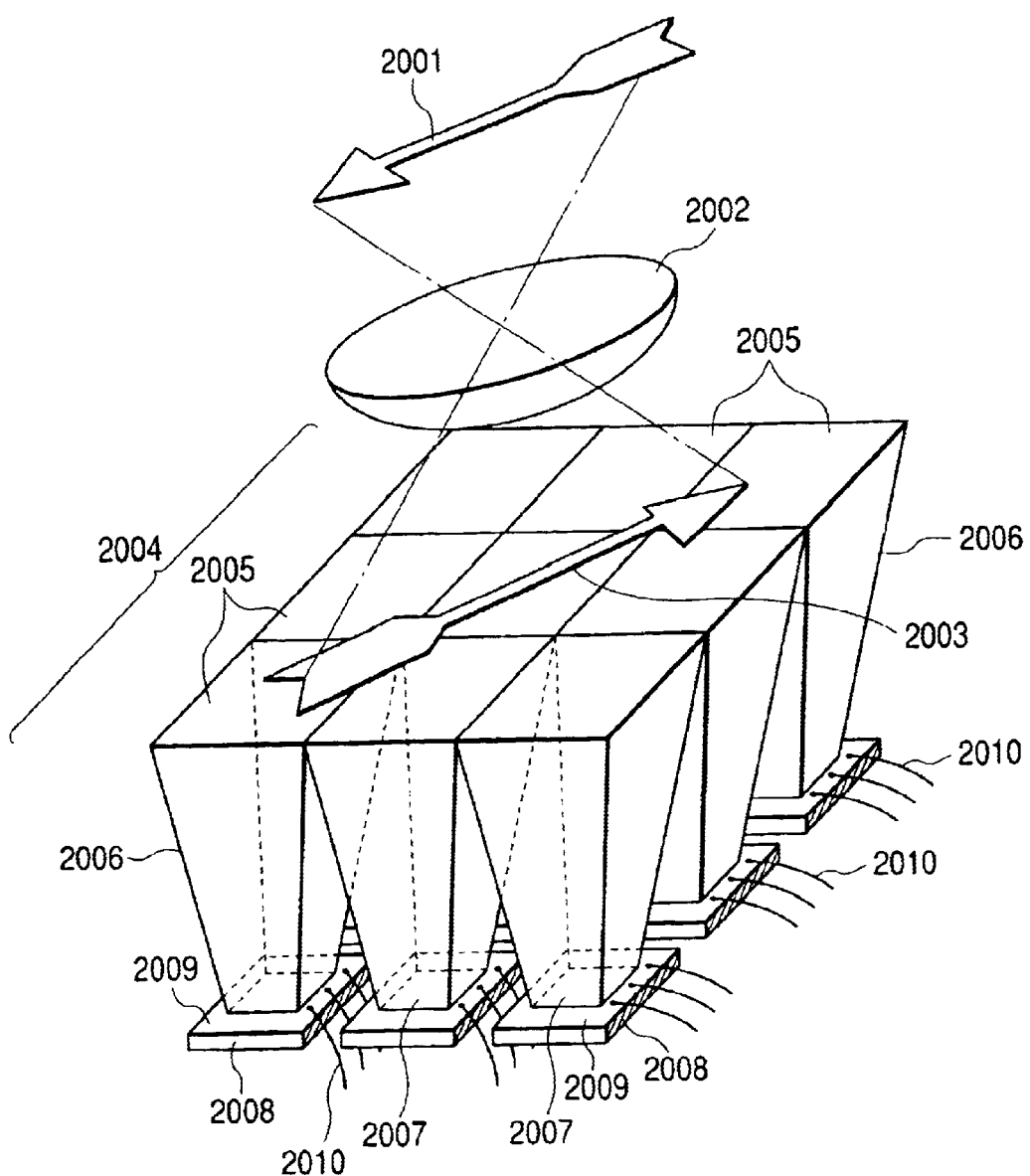
FIG. 2 is a view showing prior art 2.
Figure 3:
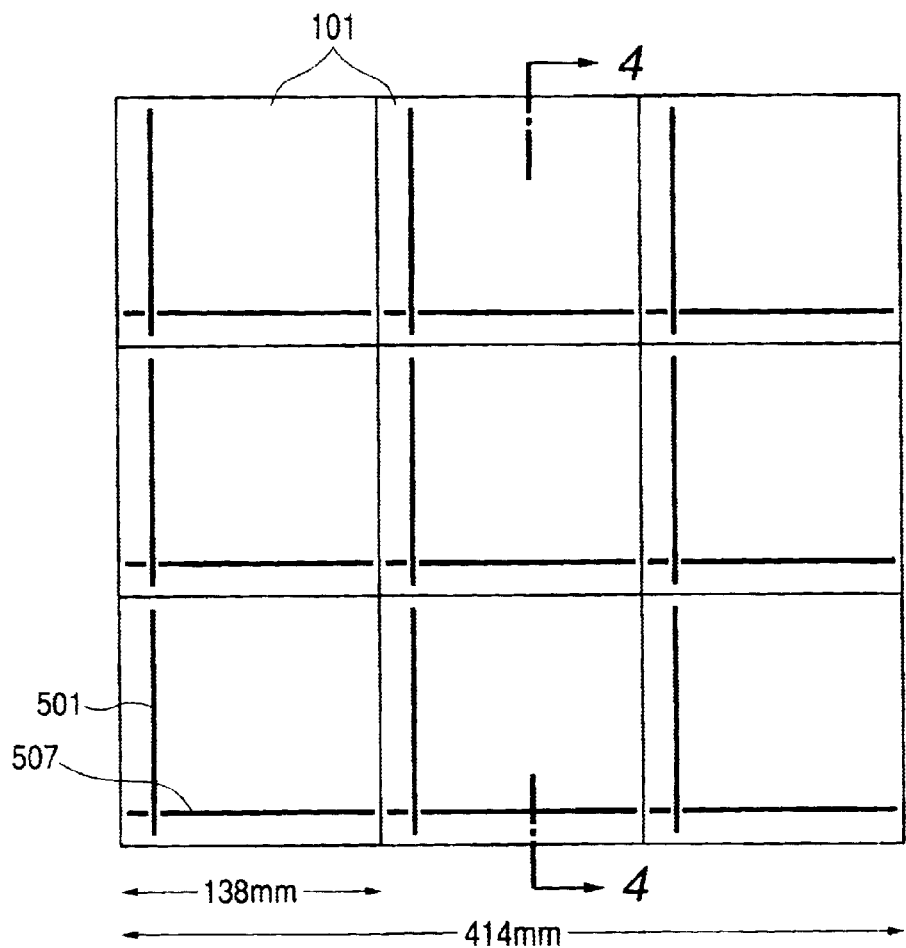
FIG. 3 is a plan view showing the layout of image pickup elements and the layout of scan circuits in an image pickup apparatus according to an embodiment of the present invention.

FIG. 3 shows the image pickup element portion of a 414-mm square large X-ray image pickup apparatus formed by bonding, like tiles, nine 138-mm square image pickup elements 101 formed on a single semiconductor substrate by a CMOS process.

Figure 4:
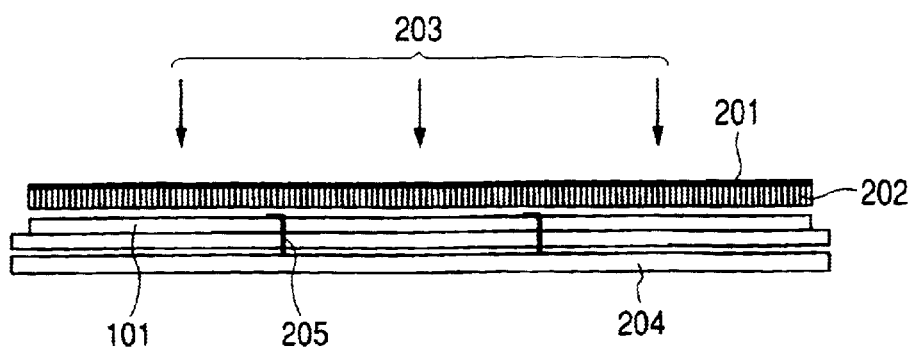
FIG. 4 is a sectional view showing the structure of the image pickup apparatus according to the embodiment of the present invention taken along the line 4—4 in FIG. 3.

FIG. 4 shows a section taken along the line 4—4 in FIG. 3. A scintillator plate 201 made of $Gd_2O_2S$ or CsI, wherein europium or terbium is used as an activator, is arranged on FOPs 202. X-rays 203 hit the scintillator and are converted into visible light. The visible light is detected by the image pickup elements 101. It is preferable to select the scintillator such that its light emission wavelength matches the sensitivity of the image pickup elements 101. An external processing substrate 204 has a circuit for supplying power and clocks to the image pickup elements 101, or extracting signals from the image pickup elements to process them. A TAB portion (Tape Automated Bonding) 205 electrically connects each image pickup element 101 to the external processing substrate.

The nine image pickup elements 101 are bonded so as not to substantially form gaps between them. "No gaps are substantially formed" means that no omission of pixels between the image pickup elements appears on an image formed by the nine image pickup elements. Input of clocks and power to the image pickup elements 101 and output of signals from pixels are performed between the image pickup elements 101 and the external processing substrate 204 disposed on the back of the image pickup elements 101, via the TAB portions 205 connected to electrode pads attached to the end portions of the image pickup elements. Each TAB portion 205 is sufficiently thin with respect to the pixel size, and does not generate any image defect even if the TAB portion 205 extends through the gap between the image pickup elements 101.

Figure 5:
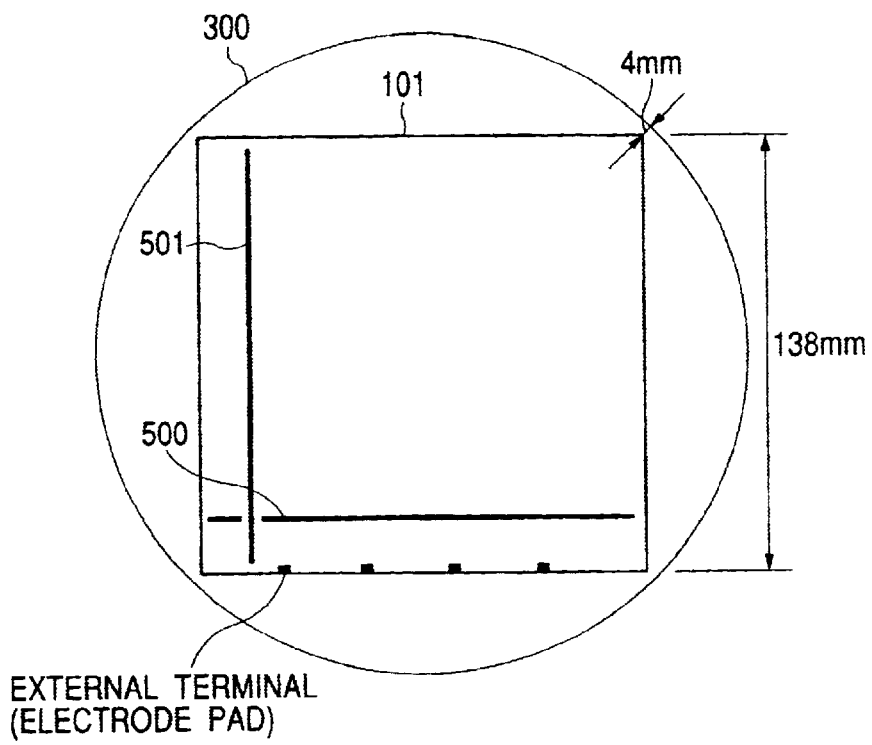
FIG. 5 is a plan view showing an image pickup element and a wafer serving as the base of the image pickup element according to the embodiment of the present invention.

FIG. 5 shows one image pickup element extracted from a currently most popular 8" wafer 300. The 8" wafer 300 is an n-type wafer, which is used to form a 138-mm square CMOS image pickup element 101 as on chip by a CMOS process.

Figure 6:
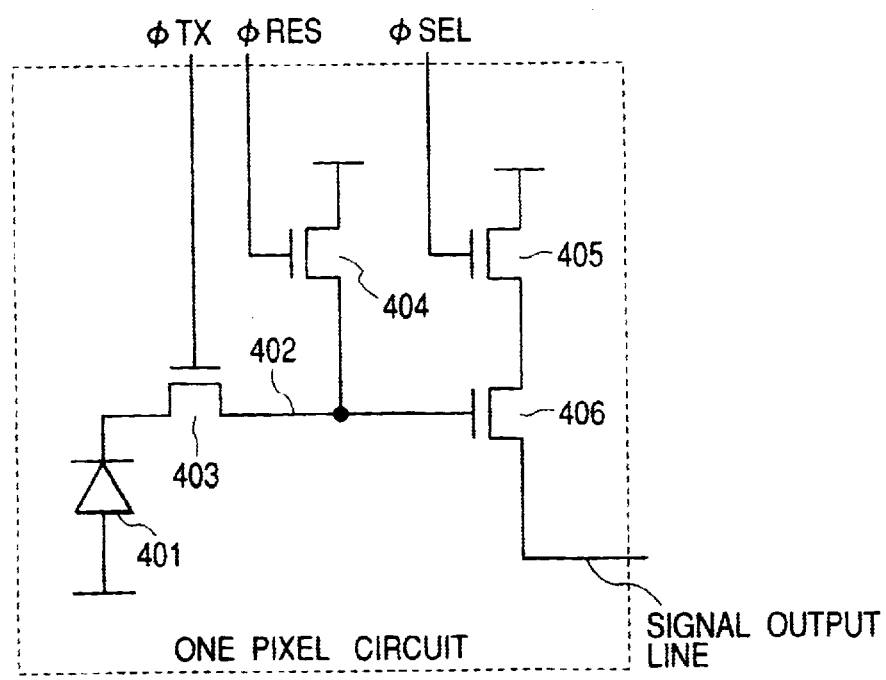
FIG. 6 is a circuit diagram showing a one-pixel circuit in the image pickup element according to the embodiment of the present invention.

FIG. 6 is a circuit diagram showing the structure of a pixel portion which constitutes each pixel of the CMOS image pickup element 101. A photodiode (photoelectric conversion unit) 401 performs photoelectric conversion. A floating diffusion layer 402 accumulates charges. A transfer MOS transistor (transfer switch) 403 transfers charges generated by the photodiode to the floating diffusion layer. A reset MOS transistor (reset switch) 404 removes charges accumulated in the floating diffusion layer. A row selection MOS transistor (row selection switch) 405 selects a row. An amplifier MOS transistor (pixel amplifier) 406 functions as a source follower.

Figure 7:
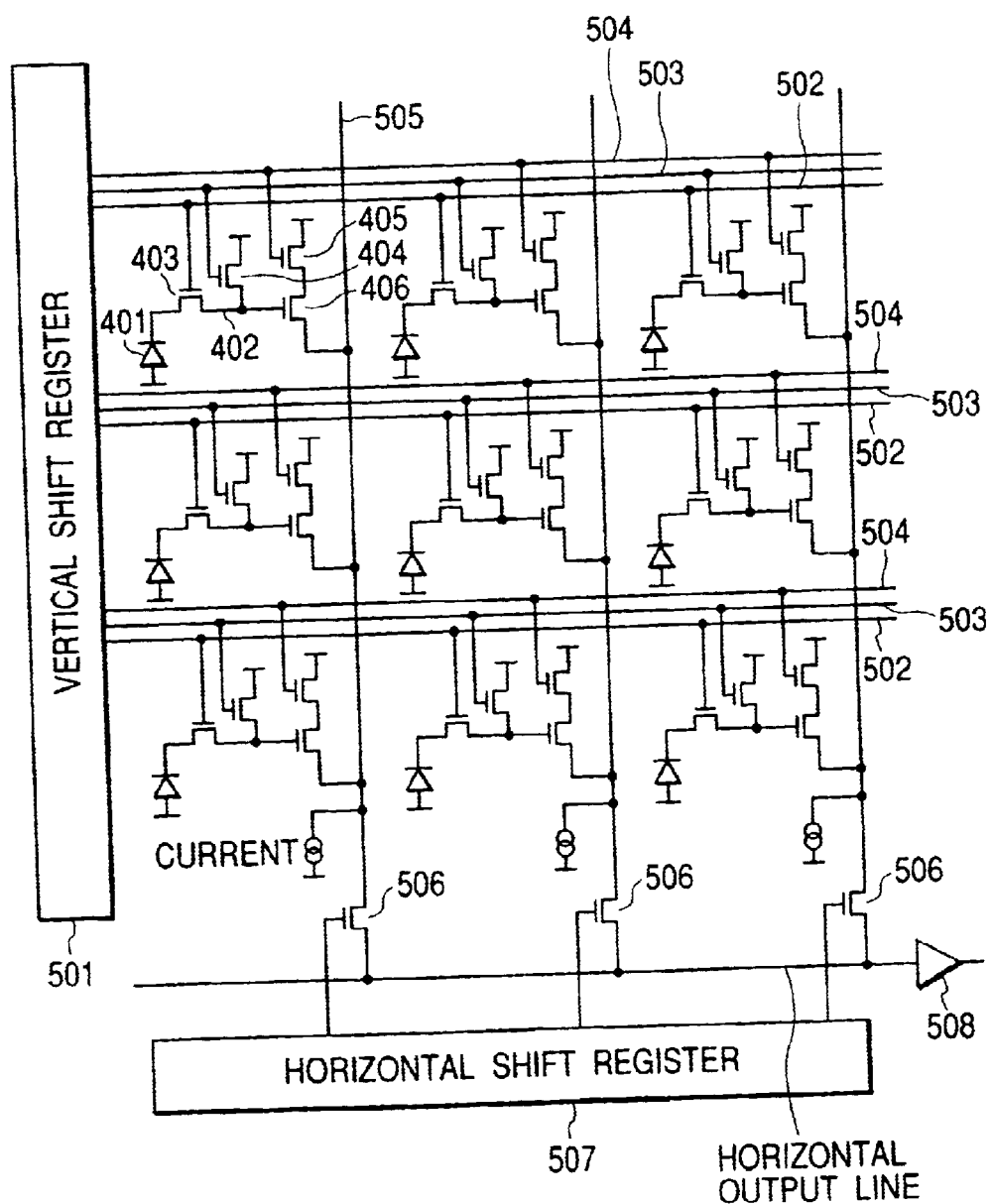
FIG. 7 is a circuit diagram showing the image pickup element according to the embodiment of the present invention.

FIG. 7 is a schematic view showing the whole circuit for 3×3 pixels.

The gate of each transfer switch 403 is connected to ΦTX 502 (transfer pulse) from a vertical shift register 501 as one kind of vertical scan circuit. The gate of each reset switch 404 is connected to ΦRES 503 (reset pulse) from the vertical scan circuit 501. The gate of each row selection switch 405 is connected to ΦSEL 504 (row selection pulse) from the vertical scan circuit 501.

Photoelectric conversion is done by the photodiode 401. The transfer switch 403 is OFF during the accumulation period of charges of the light quantity, and the gate of the source follower 406 which constitutes a pixel amplifier does not receive any charges photoelectrically converted by the photodiode. Before the start of accumulation, the reset switch 404 is turned on to initialize the gate of the source follower 406 which constitutes the pixel amplifier, to a proper voltage. This voltage serves as a dark level. Subsequently or simultaneously, the row selection switch 405 is turned on to operate the source follower circuit made up of a load current source and the pixel amplifier 406. At this time, the transfer switch 403 is turned on to transfer charges accumulated in the photodiode to the gate of the source follower 406 which constitutes the pixel amplifier.

Outputs from a selected row are supplied to vertical output lines (signal output lines) 505. The outputs are sequentially read out to an output amplifier 508 via a horizontal output line by driving column selection switches (multiplexers) 506 by a horizontal shift register 507 which is one kind of horizontal scan circuit.

Figure 8:
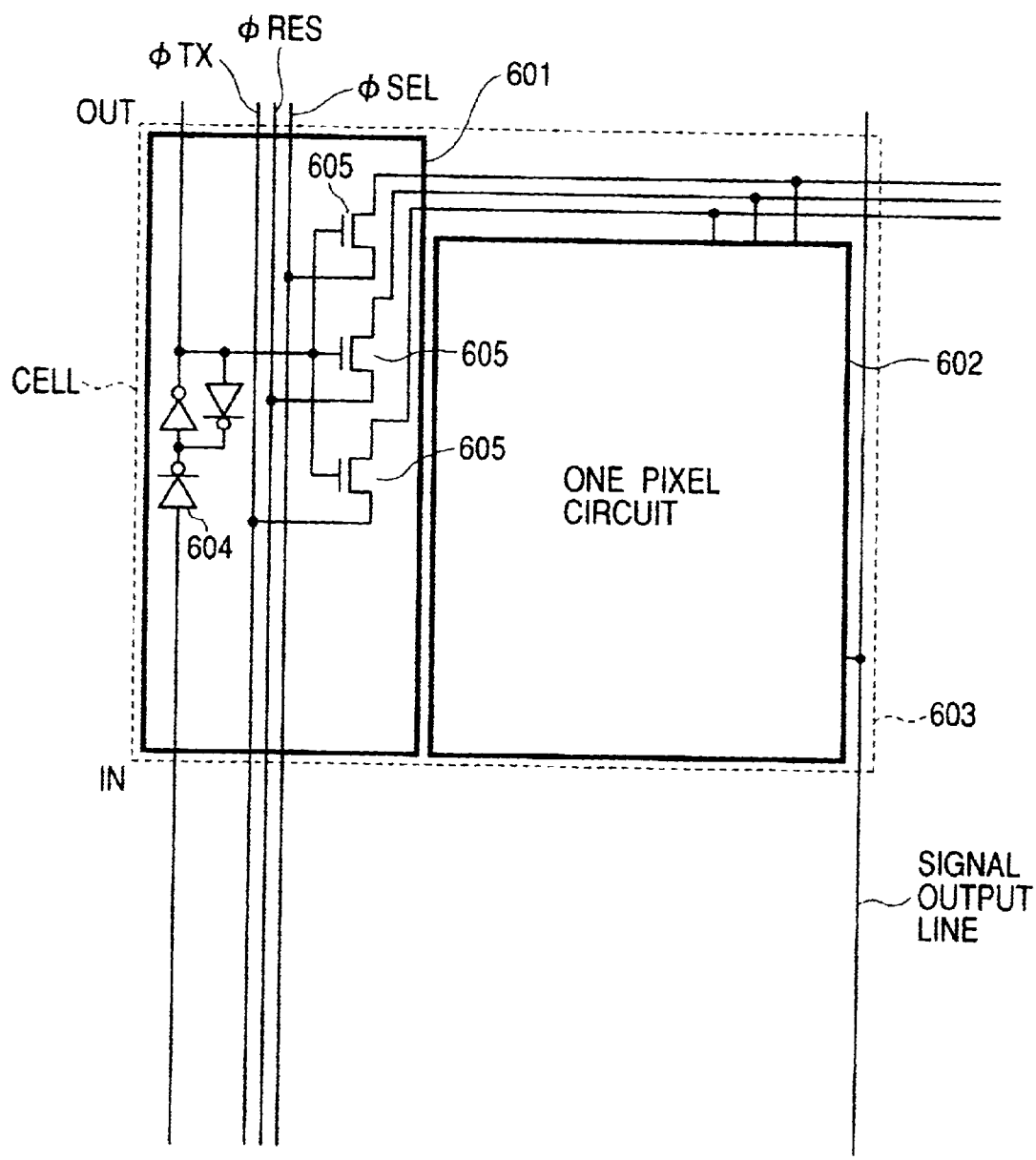
FIG. 8 is a plan view showing the conceptual arrangement of one pixel region (cell) according to the first embodiment of the present invention.

FIG. 8 shows a state wherein a unit block (unit for selecting and driving one row) 601 of the vertical shift register 501 is formed within one pixel region (one cell) 603 together with a one-pixel circuit 602. The one-pixel circuit 602 is shown in FIG. 6. The vertical shift register is represented by a simple circuit made up of a static shift resister 604 and transfer gates 605 in order to generate a transfer signal ΦTX, reset signal ΦRES, and row selection signal ΦSEL. The static shift register 604 and transfer gate 605 are driven by a signal from a clock signal line (not shown). The circuit arrangement of the shift register is not limited to this, and the shift register can take any circuit arrangement by various driving methods such as pixel addition and interlaced reading. However, the functional block is formed within one cell 603 together with the pixel circuit 602, like this embodiment, the shift register and the like are arranged within the effective pixel region, and an image pickup element having an effective pixel region on its entire surface is implemented.

The first embodiment will be described.

In the first embodiment, a vertical scan circuit such as a vertical shift register or an n:$2^n$ decoder, and a horizontal scan circuit such as a horizontal shift register or an n:$2^n$ decoder are arranged within each pixel region (cell) in an effective pixel region.

Similarly, in the first embodiment, common processing circuits are arranged within each pixel region (cell) in the effective pixel region. The common processing circuits mean circuits for commonly processing signals from a plurality of pixels at once, such as a signal output amplifier on the final stage, a serial-to-parallel conversion multiplexer, a buffer, and various gate circuits.

To the contrary, individual circuits mean circuits each for processing a signal from only one pixel, such as a photodiode, transfer switch, pixel selection switch, and pixel output amplifier circuit.

Figure 9:
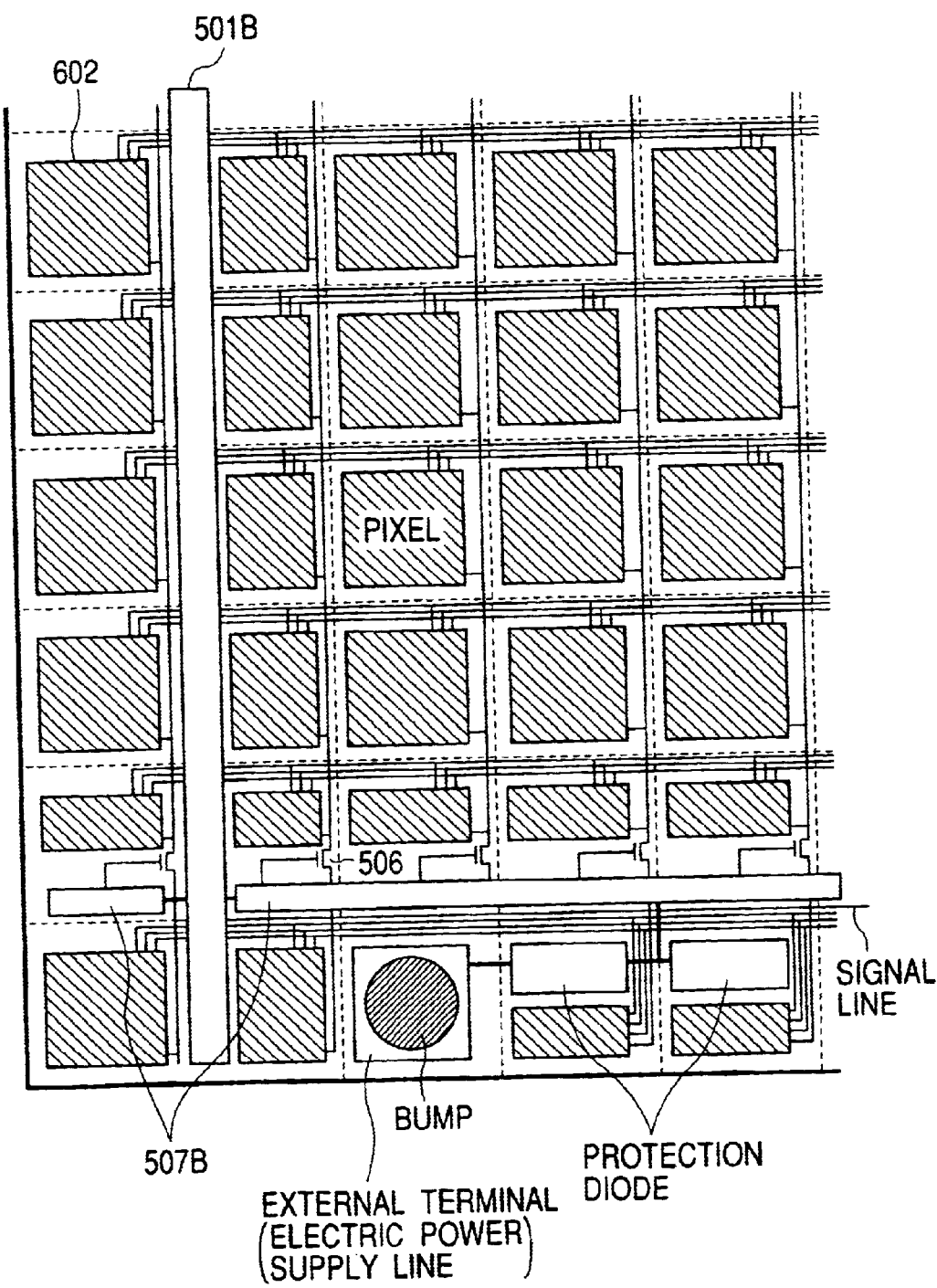
FIG. 9 is a plan view showing the layout of image pickup elements according to the first embodiment of the present invention.

FIG. 9 shows the arrangement (plan view) of an image pickup element according to the first embodiment.

In the first embodiment, a vertical shift register 501B and horizontal shift register 507B are arranged in the effective pixel region of the image pickup element.

One block 601 of the shift register for processing one line falls within one pixel pitch. These blocks are aligned as a series of vertical shift register blocks 501B and a series of horizontal shift register blocks 507B. These blocks extend linearly in the vertical and horizontal directions.

The respective areas of the light-receiving portions of given pixels where these shift register blocks 601 exist are slightly smaller than those of other pixels.

The shift register is implemented by a static shift register. The shift register can employ various circuit arrangements depending on the design. The first embodiment exemplifies a general circuit example. What is important is the use of static type.

According to the first embodiment, no dead space is generated around the image pickup element, and the entire surface of the image pickup element can be used as an effective pixel region.

These image pickup elements are arrayed like tiles substantially without any gaps, thereby forming a large image pickup apparatus. A large image which is almost seamless can be obtained.

The pixel size suffices to be as large as about 100 μm square to 200 μm square in a medical X-ray image pickup apparatus. Even if static shift registers using many building components are arranged, a sufficiently high aperture ratio can be realized.

Since the shift registers are arranged in the effective pixel region in the first embodiment, X-rays having passed through the scintillator plate directly hit the shift registers. This poses a problem because X-rays damage an element or generate an error.

An example of the error is a phenomenon that charges are accumulated at the interface between an insulating oxide film $SiO_2$ and silicon so that change of a threshold and increase of a leakage current are caused. An example of the damage is a defect generated at a p-n junction, which increases the leakage current.

Another example of the error is similar to an error (software error) caused by the action of hot electrons that is known as a malfunction of a MOS dynamic RAM.

Generation of hot electrons by an electric field readily occurs in a short-channel structure where the electric field is high. Generation of hot electrons by X-rays are independent of the size, so the image pickup apparatus becomes unstable if being hit by X-rays regardless of the planar size.

A shift register used to drive the pixel of an image pickup element will be explained. The shift register circuit is used to sequentially transfer pulse signals.

Figure 10:
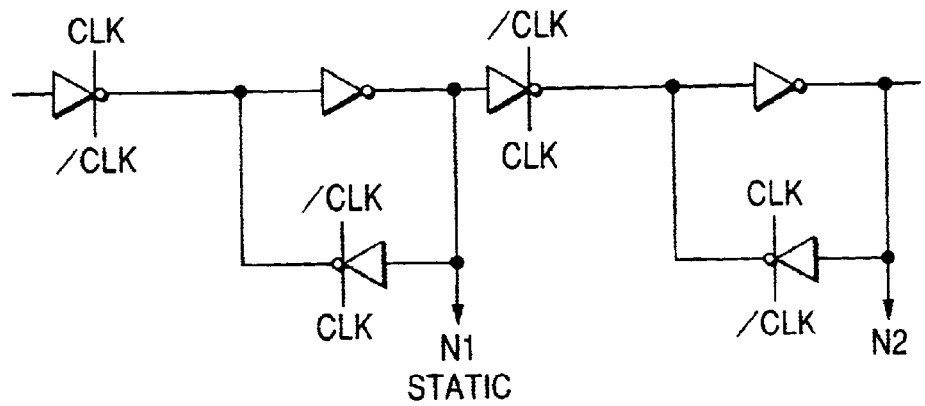
FIG. 10 is a circuit diagram showing the first example of a static shift register.
Figure 11:
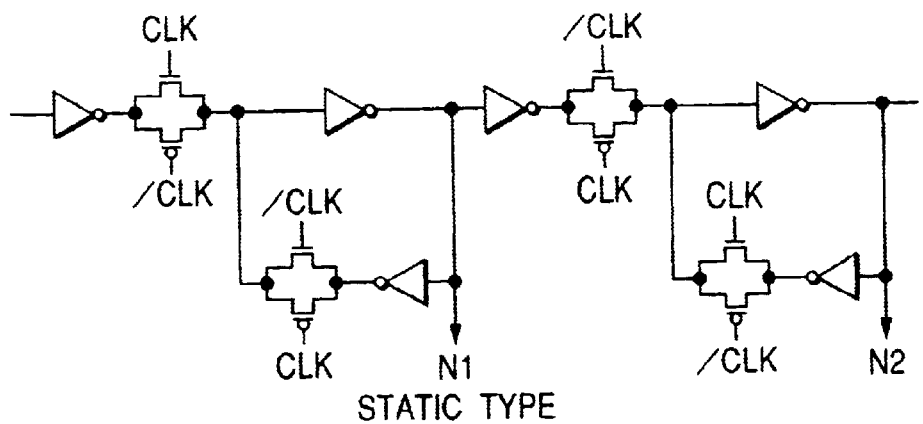
FIG. 11 is a circuit diagram showing the second example of the static shift register.

FIGS. 10 and 11 show arrangements of a static shift register circuit. This shift register circuit is disclosed in Japanese Laid-Open Patent Application No. 9-223948. One stage of the shift register circuit is constituted by one inverter and two clocked inverters in the arrangement of FIG. 10, and by three inverters and two CMOS transfer gates in the arrangement of FIG. 11. The two clocked inverters or two CMOS transfer gates receive clock signals CLK and /CLK ("/" represents negative logic) in opposite phases. Adjacent shift register circuits receive clock signals of opposite phases.

Figure 12:
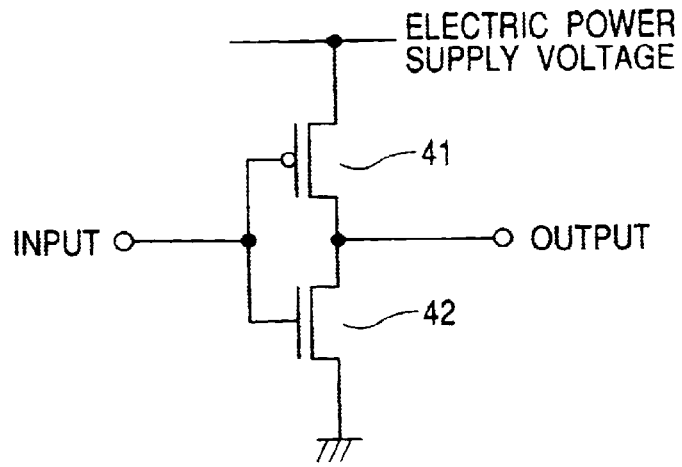
FIG. 12 is a circuit diagram showing an example of an inverter used in the shift register.

FIG. 12 is a circuit diagram showing the internal arrangement of the inverter.

Figure 13:
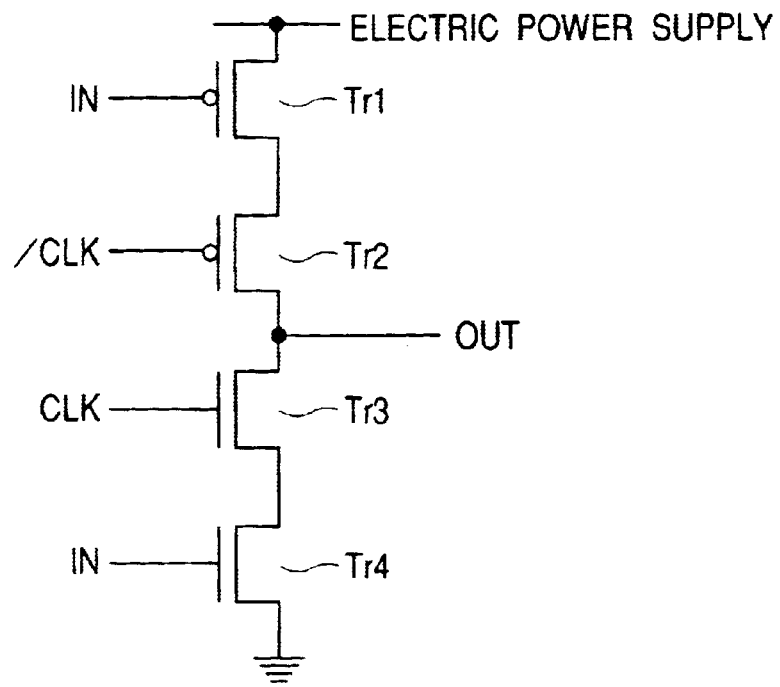
FIG. 13 is a circuit diagram showing an example of a clocked inverter used in the static shift register.

FIG. 13 is a circuit diagram showing the internal arrangement of the clocked inverter. A p-channel input transistor Tr1, p-channel clocked transistor Tr2, n-channel clocked transistor Tr3, and n-channel input transistor Tr4 are connected in series between an electric power supply and ground. An output is extracted from the node between the transistors Tr2 and Tr3.

The shift register circuit used for a driving circuit is generally driven in synchronism with two clock signals of opposite phases.

Figure 14:
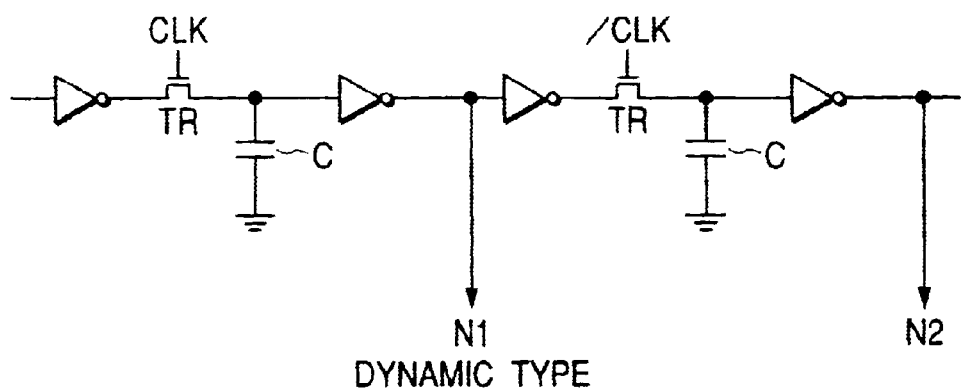
FIG. 14 is a circuit diagram showing an example of a dynamic shift register.

FIG. 14 shows an arrangement of a dynamic shift register circuit. As shown in FIG. 14, a feedback clocked inverter (or transfer gate and inverter) is used in the static shift register, whereas a capacitor C and a transistor TR which receives a clock at its gate are interposed between inverters in the dynamic shift register, thus decreasing the number of elements and power consumption. This shift circuit is disclosed in Japanese Laid-Open Patent Application No. 5-218814. In principle, the dynamic shift register holds data by accumulating charges in the capacitor.

If any leakage occurs at a p-n junction or at the interface between an insulating layer and silicon, the capacitor cannot hold charges, and thus the dynamic shift register fails in normal operation. A dynamic shift register used under irradiation of X-rays is readily damaged by X-rays, the leakage current increases, and the dynamic shift register fails to operate, thereby degrading the reliability. Moreover, a malfunction caused by hot electrons generated by X-rays inhibits obtaining a normal image.

To the contrary, the static shift register is relatively hardly influenced by X-rays in principle, and can be used at a place where X-rays directly hit the static shift register, like the first embodiment. Hence, the use of the static shift register can implement an image pickup apparatus having high reliability with little X-ray damage or few errors.

The scan circuit can be an n:2$^n$ decoder instead of the shift register. Similar to the shift register, the n:2$^n$ decoder can sequentially scan pixels by connecting the output of a sequential increment counter to the input of the decoder. An image in an arbitrary region can be obtained by random scan by inputting to the input of the decoder the address of the region from which an image is to be obtained.

The first embodiment is suitable for a large image pickup apparatus because the use of a CMOS sensor as an image pickup element reduces power consumption.

Note that the multiplexer is built into the image pickup element in order to operate the image pickup element at high speed.

A signal is externally extracted from the image pickup element via an electrode pad. A large stray capacitance exists around the electrode pad. Thus, an amplifier 508 is arranged on the input stage of the electrode pad to compensate for the transmission characteristics of a signal.

An image pickup apparatus according to the second embodiment is the same as the first embodiment in basic arrangement, but is different from the first embodiment in the layout of shift registers.

Figure 15:
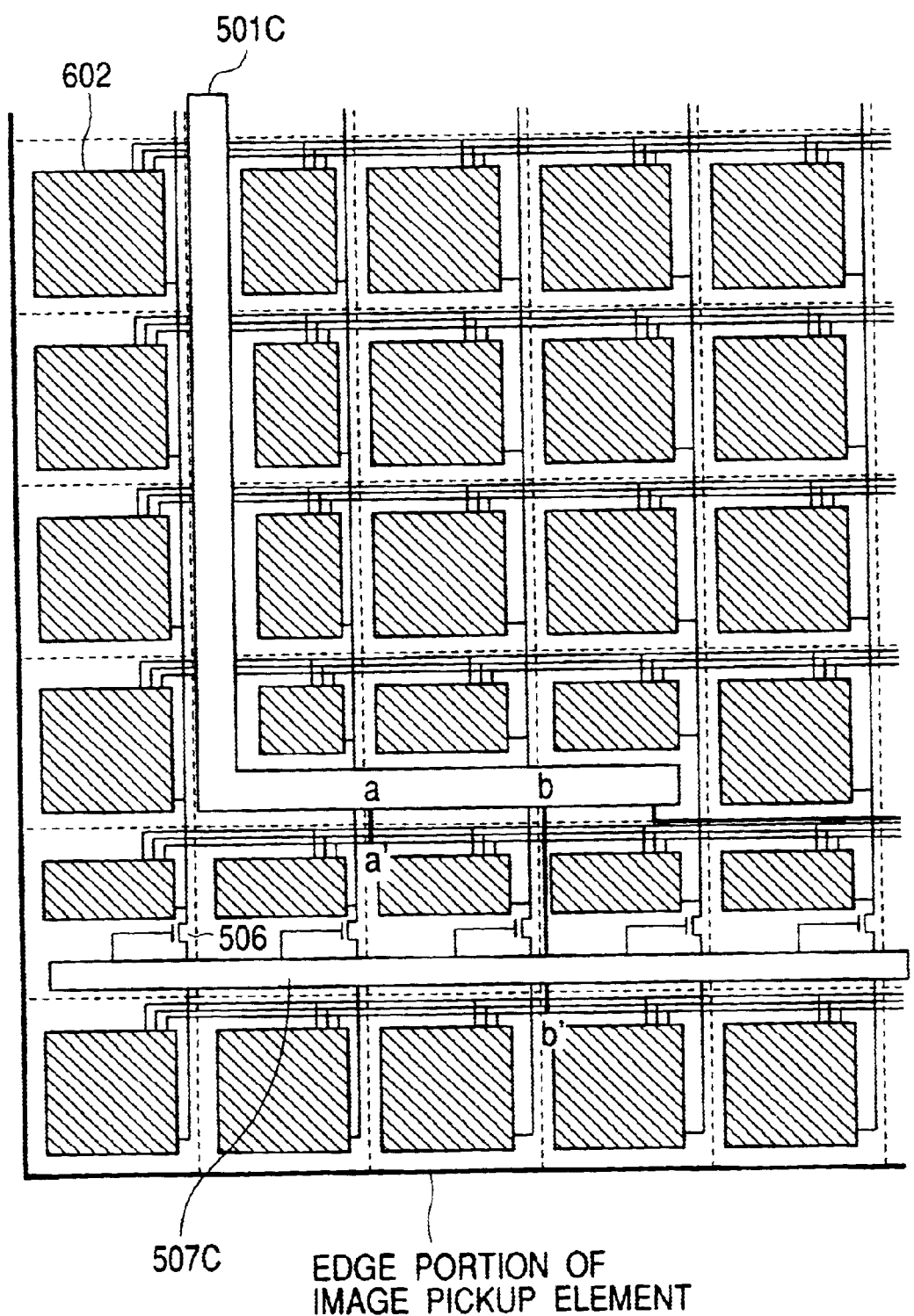
FIG. 15 is a plan view showing the layout of image pickup elements according to the second embodiment of the present invention.

In the second embodiment, as shown in FIG. 15, the blocks of a vertical shift register 501C lower in driving frequency than a horizontal shift register 507C are arranged in an L shape before the vertical shift register 501C crosses the horizontal shift register 507C. If the operation frequency is ignored, the blocks of the horizontal shift register 507C may be arranged in an L shape before the horizontal shift register 507C crosses the vertical shift register 501C.

If the vertical shift register 501B and horizontal shift register 507B are arranged in the effective pixel region, like the first embodiment, they inevitably cross each other. The cell at the intersection is occupied by the circuits of the vertical shift register 501B and horizontal shift register 507B, thus generating a pixel defect. Further, process defects may concentratedly occur at this portion where transistors concentrate. To avoid this, one shift register is arranged in an L shape before it crosses the other shift register, like the second embodiment. This can eliminate unnecessary wiring intersections and can simplify the layout.

In general, noise applied to a transmission path disturbs the waveform of a clock signal, and an equivalently high-speed clock signal is input to a reception circuit. A state transition circuit changes to an abnormal state and malfunctions upon reception of a clock signal having a pulse width shorter than the normal operation range of the circuit.

For an image pickup element having an X-Y address scan circuit (shift register), if a clock signal and data signal become abnormal, e.g., stop due to any reason, the scan circuit stops or malfunctions.

Noise is readily generated in a shift register driven at high speed. Particularly when the blocks of a shift register are arranged in an L shape, like the second embodiment, the vertical shift register having a lower driving frequency is arranged in an L shape to reduce the influence of noise caused by irregularly bending wiring lines in an L shape.

An increase in stray capacitance of the shift register decreases the response speed, thus resulting in an operation error. Especially the structure of bending the shift register, like the second embodiment, requires wiring lines (a–a' and b–b' in FIG. 15) which are unnecessary in an originally linear layout, and the stray capacitance at these wiring lines may cause an adverse effect. The second embodiment reduces the influence of a response delay caused by the stray capacitance by arranging the vertical shift register having a lower driving frequency in an L shape.

An image pickup apparatus according to the third embodiment is the same as the first embodiment in basic arrangement, but is different from the first embodiment in the layout of shift registers.

Figure 16:
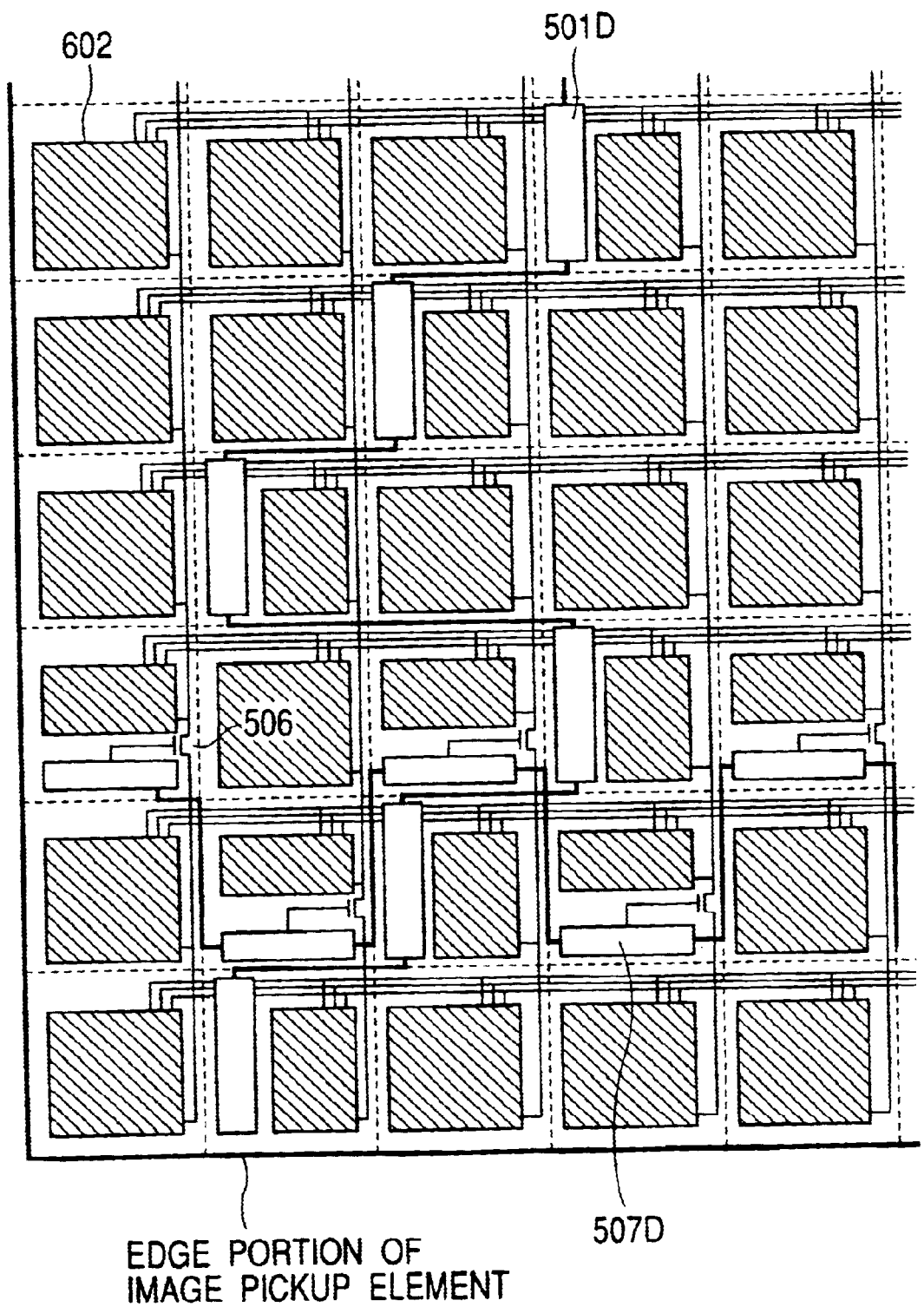
FIG. 16 is a plan view showing the layout of image pickup elements according to the third embodiment of the present invention.

In the third embodiment, as shown in FIG. 16, adjacent one-line driving blocks of a shift register are not successive on the same straight line. The respective blocks of a vertical shift register 501D are arranged on proper Y lines so as not to arrange all the blocks on one straight line in the vertical direction. The blocks of a horizontal shift register 507D are also similarly arranged.

The light-receiving region of a pixel where a shift register block exists is narrower than that of another pixel. Such pixels aligned on one straight line may provide an unnatural image. The third embodiment can reduce the image unnaturalness by appropriately distributing pixels.

An image pickup apparatus according to the fourth embodiment is the same as the first embodiment in basic arrangement, but is different from the first embodiment in the layout of shift registers.

Figure 17:
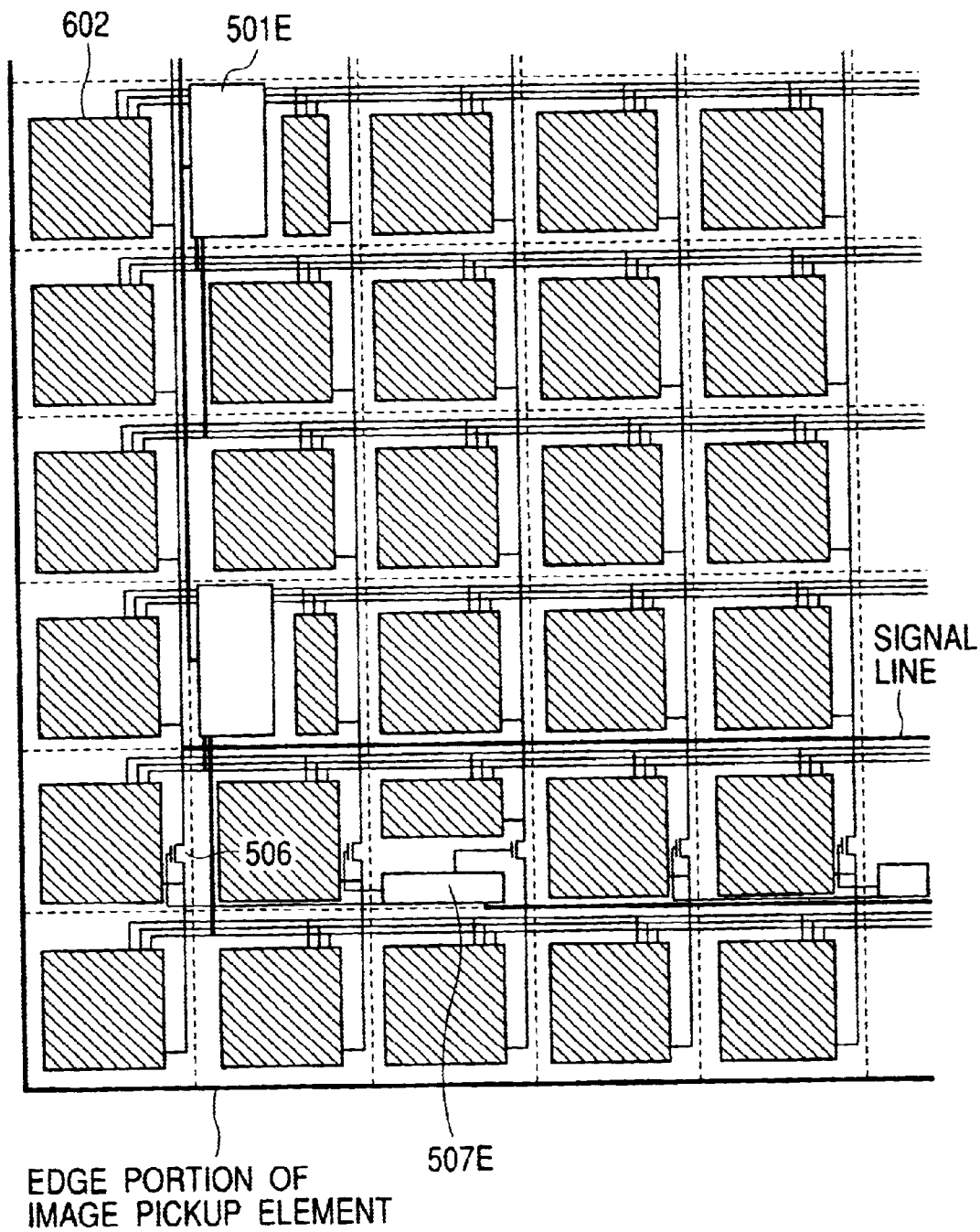
FIG. 17 is a plan view showing the layout of image pickup elements according to the fourth embodiment of the present invention.

In the fourth embodiment, as shown in FIG. 17, a circuit for scanning three lines of a shift register is set as one block, and such blocks are arranged every three lines to constitute a vertical shift register 501E. A horizontal shift register 507E is similarly constituted. A cell where the block exists is not entirely occupied by the block, and also contains a one-pixel circuit 602. As far as this condition is satisfied, the fourth embodiment includes a vertical register constituted by providing as one block a circuit for scanning a plurality of lines of a shift register and arranging such blocks for every plurality of lines.

The light-receiving region of a pixel where a shift register block exists is narrower than that of another pixel. Such pixels aligned on one straight line may provide an unnatural image. The fourth embodiment can reduce the image unnaturalness by providing shift register circuits as one block for every three lines and arranging such blocks.

An image pickup apparatus according to the fifth embodiment is the same as the first embodiment in basic arrangement, but is different from the first embodiment in the layout of shift registers.

Figure 18:
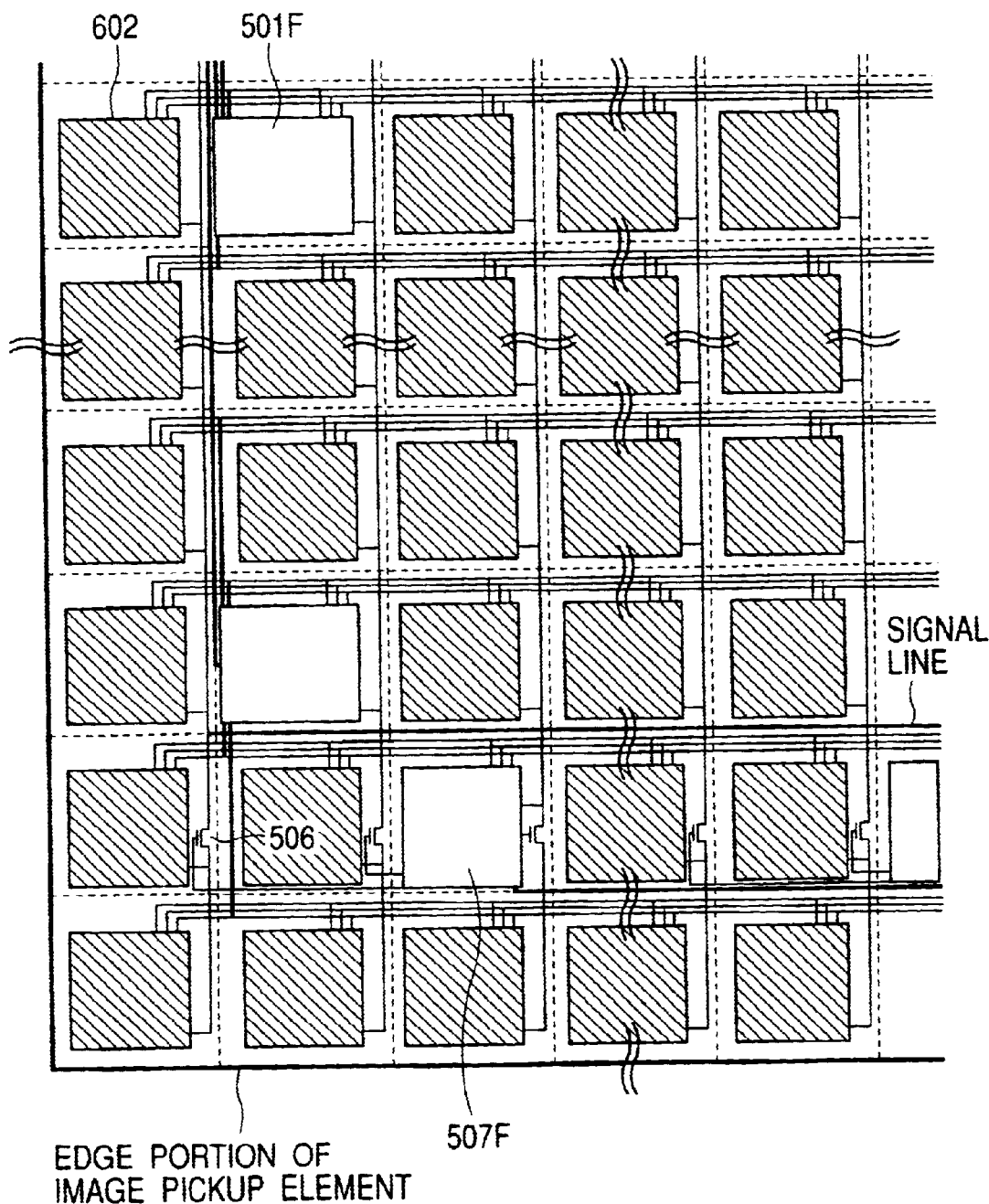
FIG. 18 is a plan view showing the layout of image pickup elements according to the fifth embodiment of the present invention.

In the fifth embodiment, as shown in FIG. 18, a circuit for scanning n lines (n is a natural number) of a shift register is set as one block, and such blocks are arranged at every n lines to constitute a vertical shift register 501F. A horizontal shift register 507F is similarly constituted. A cell where the block exists is entirely occupied by the block, and does not have any one-pixel circuit 602.

The light-receiving region of a pixel where a shift register block exists is narrower than that of another pixel. Such pixels aligned on one straight line may provide an unnatural image. The fifth embodiment can reduce the image unnaturalness by providing shift register circuits as one for block every n lines and arranging such blocks.

Figure 19:
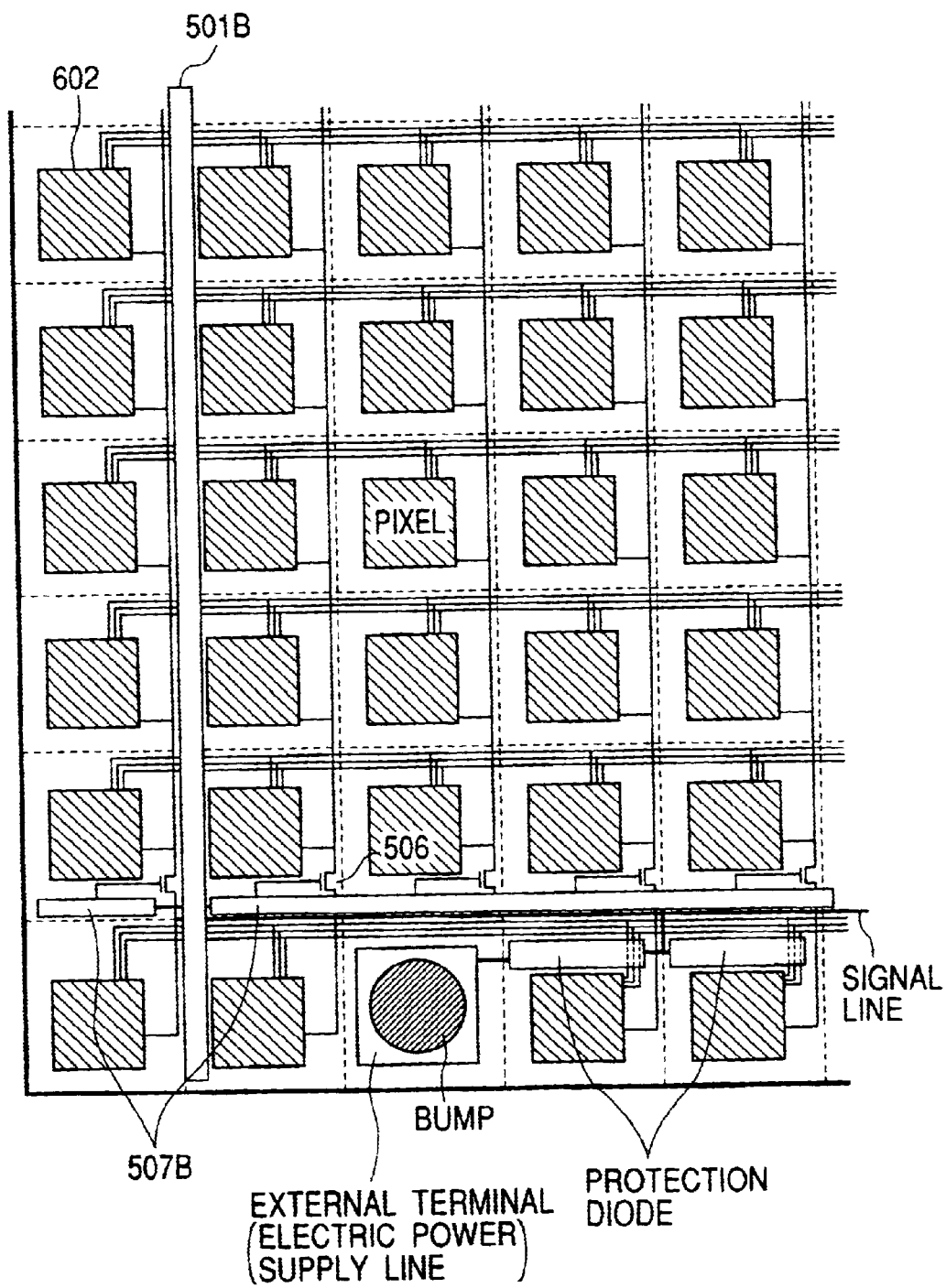
FIG. 19 is a plan view showing the layout of image pickup elements according to the sixth embodiment of the present invention.

In the sixth embodiment, as shown in FIG. 19, at least the light-receiving regions of pixels are equal in area and pitch. In FIG. 19, the area of a one-pixel circuit is equal between cells, and the area of the light-receiving region (not shown in FIG. 19) in the one-pixel circuit is also equal between cells. The area of the light-receiving region is preferably equal between all cells, but the area of the light-receiving region in a cell on one line at the end portion of an image pickup element may be different from that of the light-receiving region in an internal cell in order to ensure a slice margin.

Figure 20:
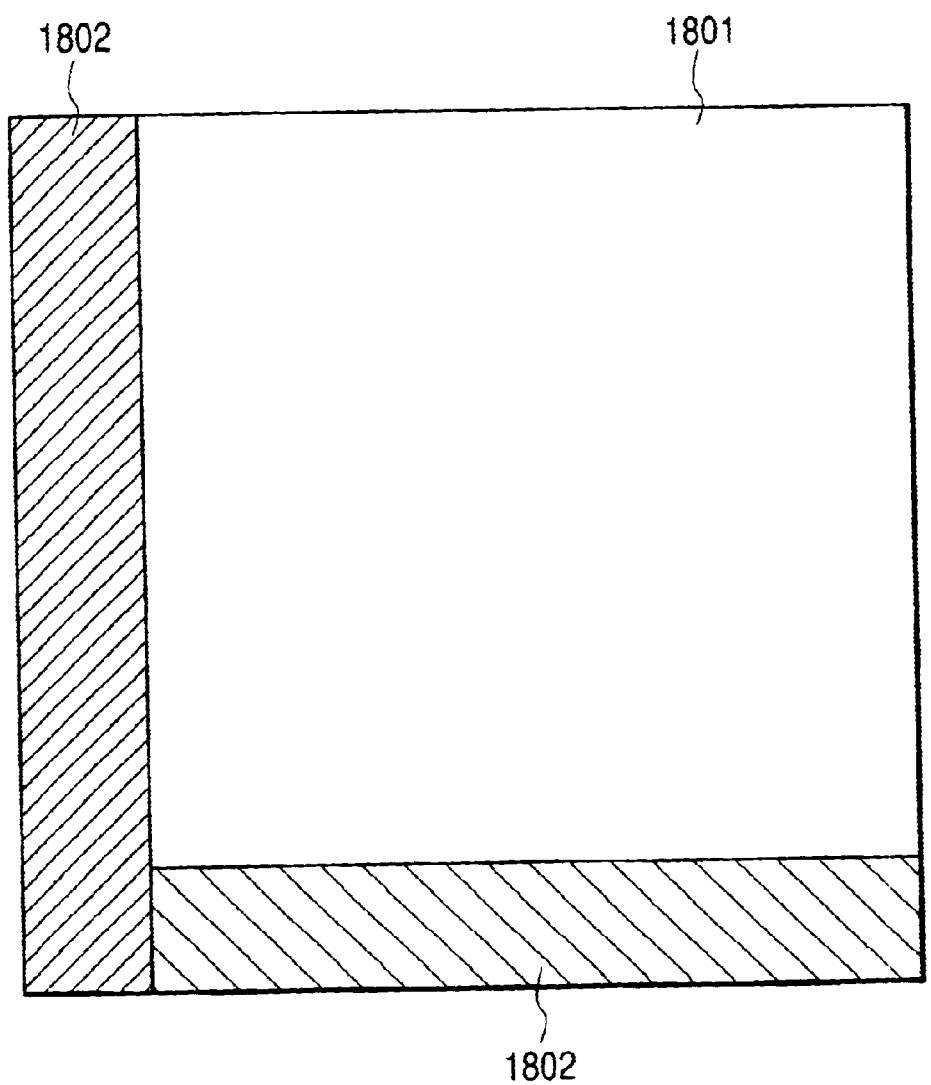
FIG. 20 is a plan view showing the layout of one pixel region of the image pickup element according to the sixth embodiment of the present invention.

FIG. 20 shows the layout of one pixel region (cell) where shift registers are arranged. This pixel region includes a light-receiving region 1801, a shift register block 1802, and a region 1803 for a switch and pixel amplifier.

In FIG. 20,

Cell Size: 150 $\mu$m square

One Block of Shift Register: 20 $\mu$m×150 $\mu$m

Light-Receiving Region of Pixel: 130 $\mu$m square

Region for Switch and Pixel Amplifier:
130 $\mu$m×20 $\mu$m

From this, the aperture ratio is 75%.

The layout of one pixel region where no shift register is arranged is obtained by eliminating the shift register block 1802 from the layout shown in FIG. 20. At least the light-receiving region of one pixel region where no shift register is arranged is the same as the light-receiving region 1801 of one pixel region (cell) where a shift register is arranged.

By simplifying the functions of the shift register block 1802, the occupation ratio to the cell can be decreased to a degree as shown in FIG. 20. However, an increase in the number of functions widens the shift register block 1802, which is not included in the sixth embodiment unless the aperture ratio is restricted.

According to the sixth embodiment, large pixels and a properly sized shift register are used, and the light-receiving region is set equal in size between pixels. Even if the shift register and the like are arranged in the effective pixel region, the sensitivity and the barycenter of the pixel do not vary.

In the seventh embodiment, an electric power supply line is positioned as an X-ray shielding member on a shift register and/or common processing circuit in each of the first to sixth embodiments. The electric power supply line is made of, e.g., copper exhibiting a high X-ray absorbency index.

As described above, according to the first to seventh embodiments, the entire surface of an image pickup element is used as an effective pixel region, and a scan circuit and common processing circuit are interposed between pixels in the effective pixel region. Image pickup elements can be so arrayed as not to substantially form any gap between them. Even when a given image pickup element is surrounded by other image pickup elements to constitute an image pickup apparatus for forming one image by five (for a cross-shaped region) or nine (for a rectangular region of three rows×three columns) or more image pickup elements, no image discontinuity or omission is generated between the image pickup elements.

The image pickup apparatus having the above arrangement can use not an amorphous silicon image pickup element but a single-crystal image pickup element which is difficult to increase its size, and can pick up a large or high-resolution moving picture with a high S/N ratio.

No tapered FOP need be used, which can reduce the cost of the image pickup apparatus.

The eighth embodiment will be described.

Figure 21:
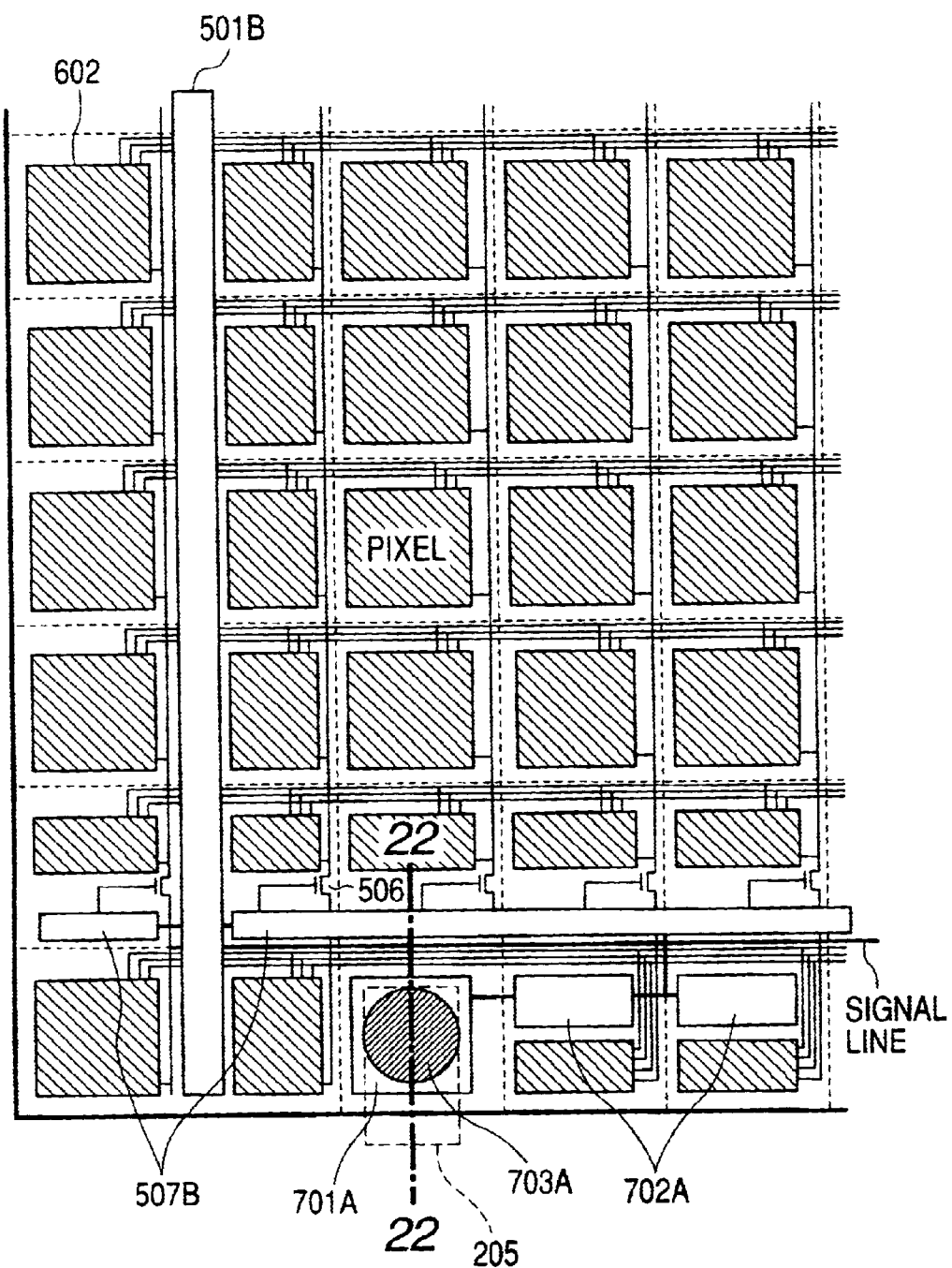
FIG. 21 is a plan view showing the layout of image pickup elements according to the eighth embodiment of the present invention.

FIG. 21 shows the arrangement (plan view) of an image pickup apparatus according to the eighth embodiment.

In the eighth embodiment, a vertical shift register 501B and horizontal shift register 507B are arranged in the effective pixel region of an image pickup element.

One block 601 of the shift register for processing one line is arranged so as to fall within one pixel pitch. These blocks are aligned as a series of vertical shift register blocks 501B and a series of horizontal shift register blocks 507B. These blocks extend linearly in the vertical and horizontal directions.

The areas of the light-receiving portions of pixels where these shift register blocks 601 exist are slightly smaller than those of other pixels.

Figure 22:
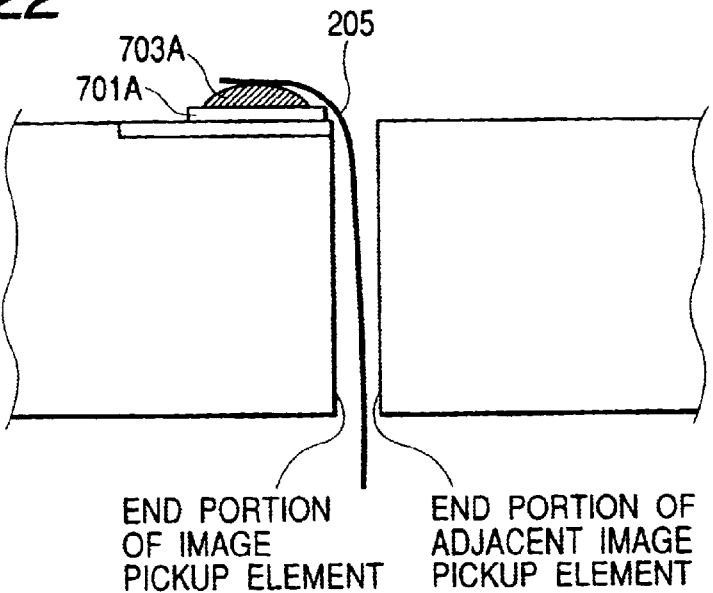
FIG. 22 is a sectional view showing a state wherein a TAB portion is connected to an external terminal and extends between image pickup elements according to the eighth embodiment of the present invention.

In the eighth embodiment, an external terminal 701A and protection circuits 702A are arranged within one pixel region at the end portion of the image pickup element. The external terminal 701A has a bump 703A. As shown in FIG. 22, the bump 703A is connected to a TAB portion 205 so as to be electrically connected to an external processing substrate 204 arranged at the back of image pickup elements arrayed like tiles.

In the eighth embodiment, a one-pixel circuit 602 is not formed in one pixel region (cell) where the external terminal 701 is arranged, but is formed in one pixel region where the protection circuit 702 is arranged.

According to the eighth embodiment, the external terminal 701 and protection circuits 702 are arranged within the pixel region, and thus no region for the external terminal 701 and protection circuits 702 need be ensured on each image pickup apparatus separately from the pixel region. No dead space is substantially formed, and an image pickup element having an effective pixel region on its entire surface can be implemented. As a result, a plurality of single-crystal image pickup elements can be bonded like tiles substantially seamlessly.

The protection circuit 702A can be formed by the same CMOS process as that of the one-pixel circuit 602 and the like, and can be formed at an arbitrary position.

The protection circuit will be explained.

Figure 23:
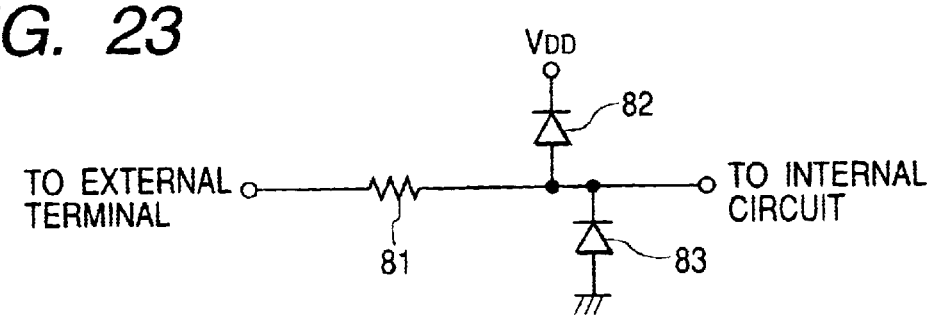
FIG. 23 is an equivalent circuit diagram showing an example of a protection circuit.

A protection circuit made up of a protection resistor 81 (made of, e.g., polysilicon) and protection p-n junction diodes 82 and 83, as shown in the equivalent circuit of FIG. 23, is interposed between the external terminal and internal circuit of a CMOS image pickup element in order to protect the internal circuit from electrostatic breakdown. If a high voltage is applied to the external terminal, the voltage reaches the protection diodes 82 and 83 via the protection resistor 81 and an aluminum wiring line, and one of the protection diodes 82 and 83 is turned on and discharged to an electric power supply potential Vcc or ground potential Vss. As a result, a high voltage is not applied to the internal circuit. The protection resistor 81 limits a current generated by discharge, and attenuates a high voltage to some extent before the voltage reaches the protection diodes 82 and 83.

Figure 24:
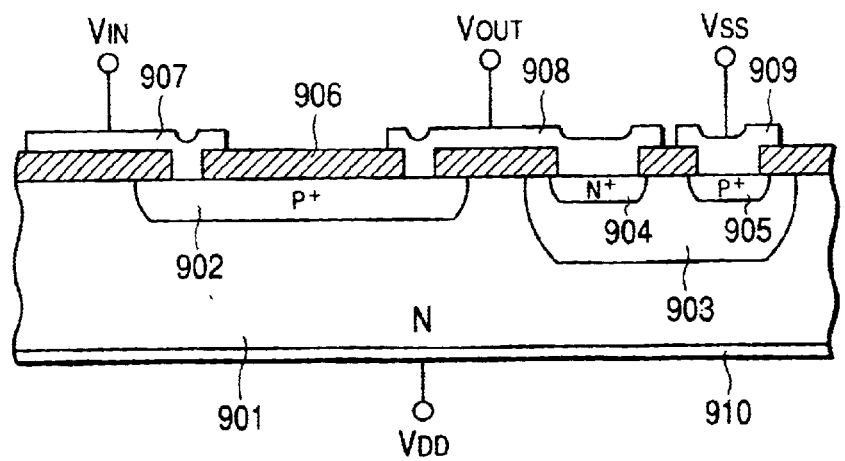
FIG. 24 is a sectional view showing the structure of the protection circuit.

FIG. 24 shows a general arrangement of the protection circuit 702A. A $p^+$-type diffusion resistor 902 is formed in the surface of an n-type semiconductor substrate 901. One terminal of the $p^+$-type diffusion resistor 902 is connected to an input electrode 907, and the other terminal is connected to an output electrode 908. A p-n junction diode on the electric power supply side is formed between the $p^+$-type diffusion resistor 902 and the n-type semiconductor substrate 901. A p-well diffusion region 903 is formed at another portion of the n-type semiconductor substrate 901, and an $n^+$-type diffusion region 904 connected to the output electrode 908 is formed near the surface of the p-well diffusion region 903. The $n^+$-type diffusion region 904 and p-well diffusion region 903 form a p-n junction diode at the ground side. A $p^+$-type diffusion region 905 is used to ground the p-well diffusion region 903. The protection circuit 702A further comprises a field oxide layer 906, ground electrode 909, and electric power supply electrode 910.

The external terminal 701A, protection circuit 702A, and bump 703A described in the eighth embodiment are provided for an electric power supply. An actual image pickup element further comprises external terminals, protection circuits, and bumps for input signals such as a clock signal supplied to the shift register and output signals such as a read signal from each pixel.

An image pickup apparatus according to the ninth embodiment is the same as the eighth embodiment in basic arrangement, but is different from the eighth embodiment in the layout of an external terminal and protection circuit.

Figure 25:
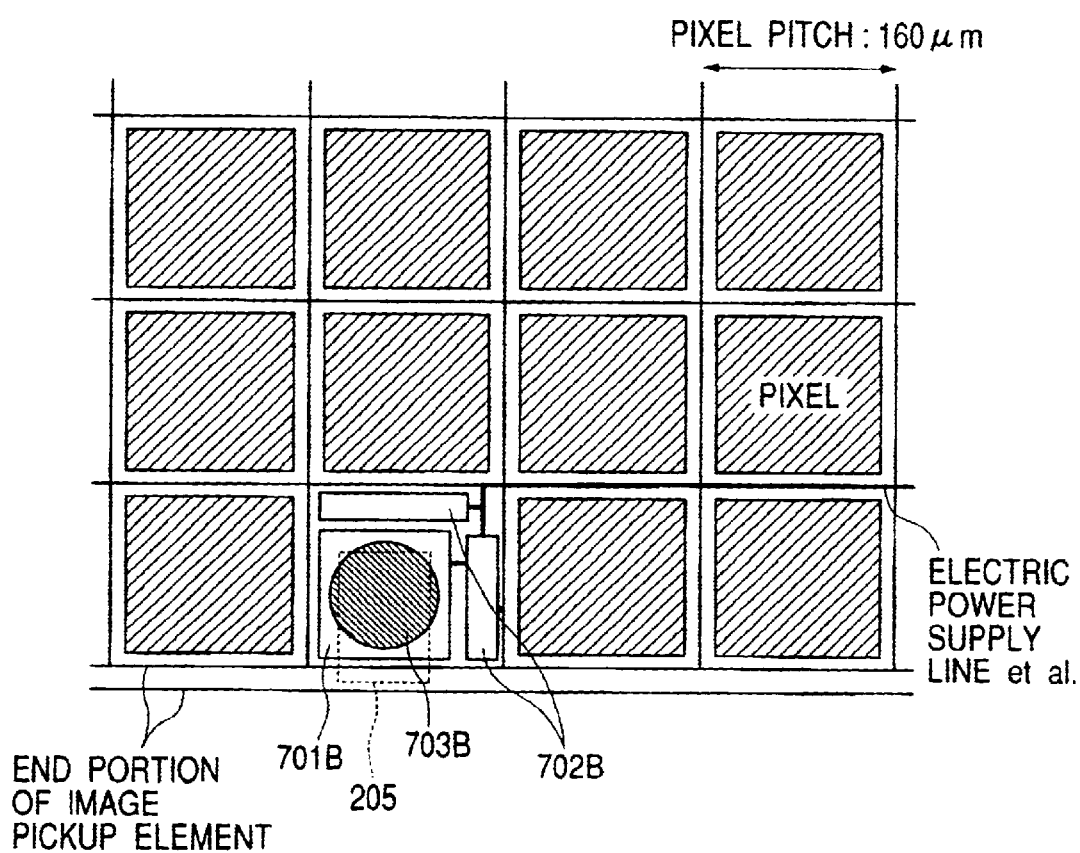
FIG. 25 is a plan view showing the layout of image pickup elements according to the ninth embodiment of the present invention.

In the ninth embodiment, as shown in FIG. 25, an external terminal 701B having a bump 703B, and protection circuits 702B are arranged within one pixel region. The pixel pitch is 160 µm.

The ninth embodiment can minimize the number of pixel regions where no one-pixel circuit 602 is formed.

An image pickup apparatus according to the tenth embodiment is the same as the eighth embodiment in basic arrangement, but is different from the eighth embodiment in the layout of an external terminal and protection circuit.

Figure 26:
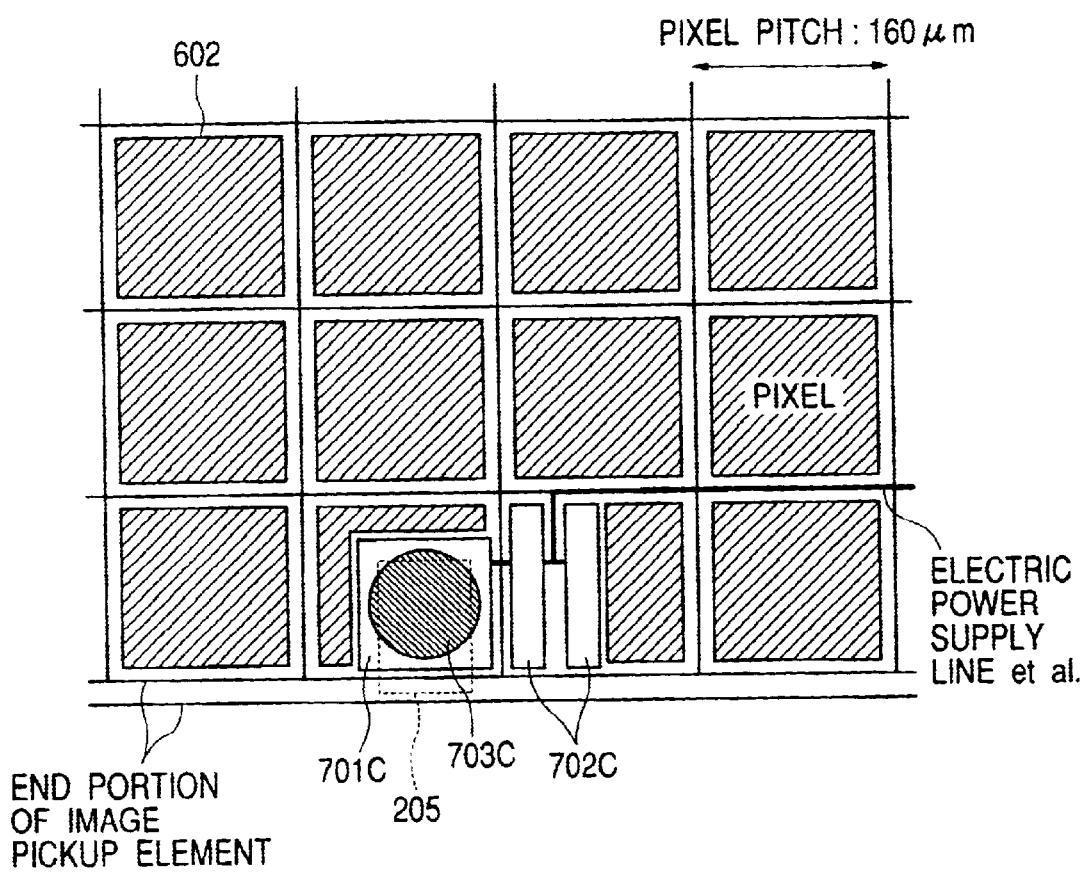
FIG. 26 is a plan view showing the layout of image pickup elements according to the tenth embodiment of the present invention.

In the tenth embodiment, as shown in FIG. 26, an external terminal 701C having a bump 703C is disposed at part of one pixel region, whereas protection circuits 702C are disposed at part of another pixel region. The pixel pitch is 160 µm.

The tenth embodiment can eliminate any pixel defect because one-pixel circuits 602 can be formed in one pixel region where the external terminal 701C is arranged and one pixel region where the protection circuits 702C are arranged.

An image pickup apparatus according to the eleventh embodiment is the same as the eighth embodiment in basic arrangement, but is different from the eighth embodiment in the layout of an external terminal and protection circuit.

Figure 27:
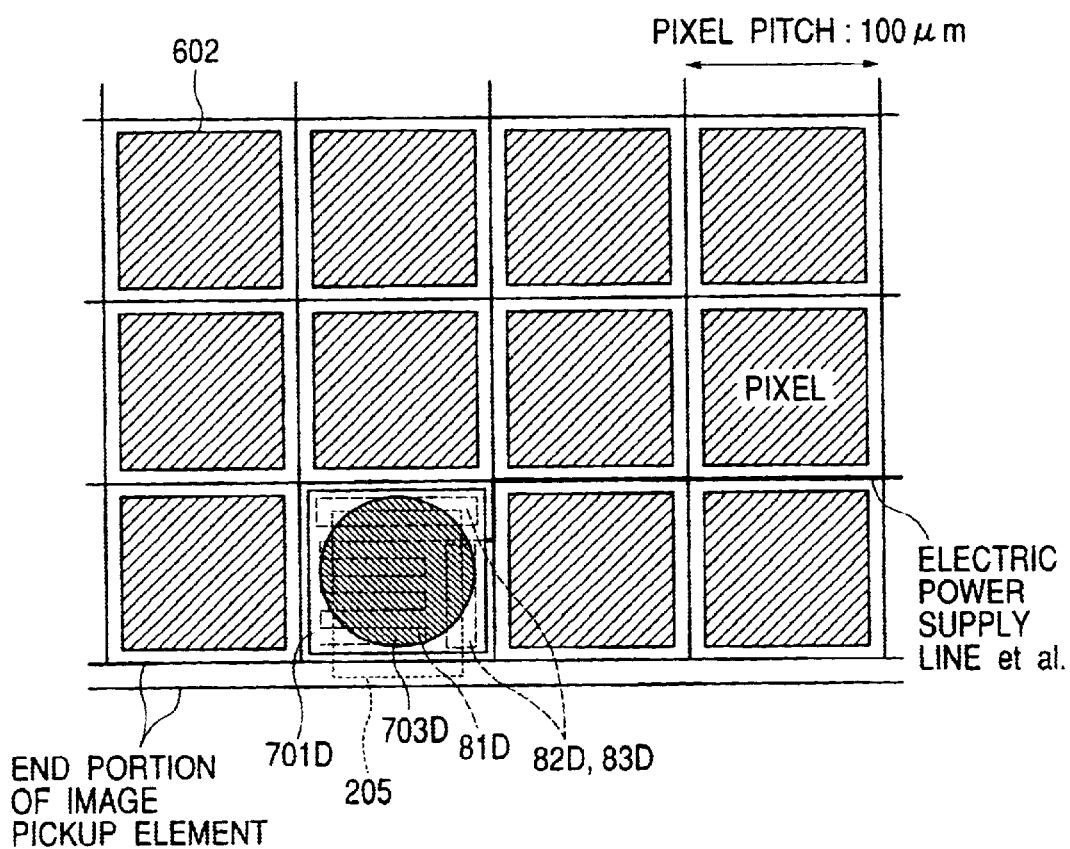
FIG. 27 is a plan view showing the layout of image pickup elements according to the eleventh embodiment of the present invention.

In the eleventh embodiment, as shown in FIG. 27, an external terminal 701D having a bump 703D, protection diodes 82D and 83D, and protection resistor 81D are arranged within one pixel region. The pixel pitch is 100 µm.

Even with a small pixel pitch, the eleventh embodiment can minimize the number of pixel regions where no one-pixel circuit 602 is formed.

An image pickup apparatus according to the twelfth embodiment is the same as the eighth embodiment in basic arrangement, but is different from the eighth embodiment in the layout of an external terminal and protection circuit.

Figure 28:
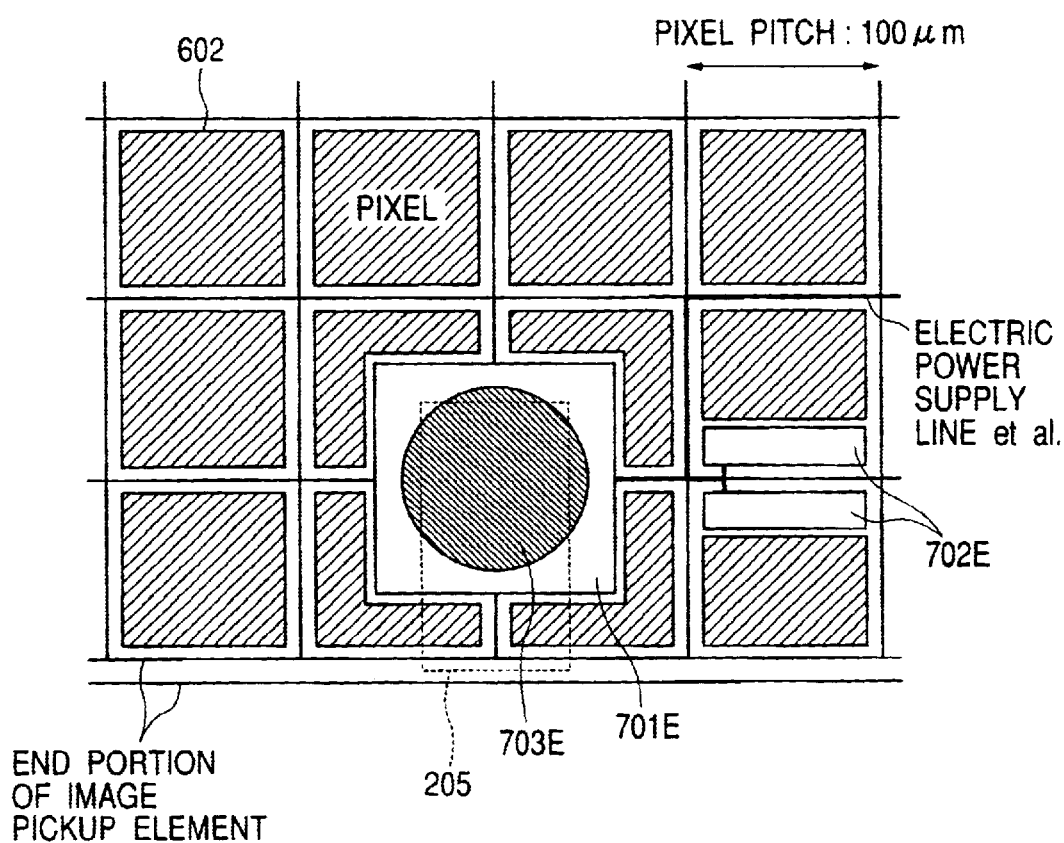
FIG. 28 is a plan view showing the layout of image pickup elements according to the twelfth embodiment of the present invention.

In the twelfth embodiment, as shown in FIG. 28, one external terminal 701E having a bump 703E overlaps four pixel regions. The external terminal 701E occupies only part of each pixel region. A protection circuit 702E is disposed at part of one pixel region.

Even with a small pixel pitch, the twelfth embodiment can minimize the number of pixel regions where no one-pixel circuit 602 is formed.

Moreover, even with a small pixel pitch, the twelfth embodiment can eliminate any pixel defect because the one-pixel circuits 602 can be formed in one pixel region where the external terminal 701E is arranged and in one pixel region where the protection circuit 702E is arranged.

In the twelfth embodiment, a bump which is larger than a pixel is arranged. The twelfth embodiment facilitates electrical packaging because the bump is large.

An image pickup apparatus according to the thirteenth embodiment is the same as the eighth embodiment in basic arrangement, but is different from the eighth embodiment in the layout of an external terminal and protection circuit.

Figure 29:
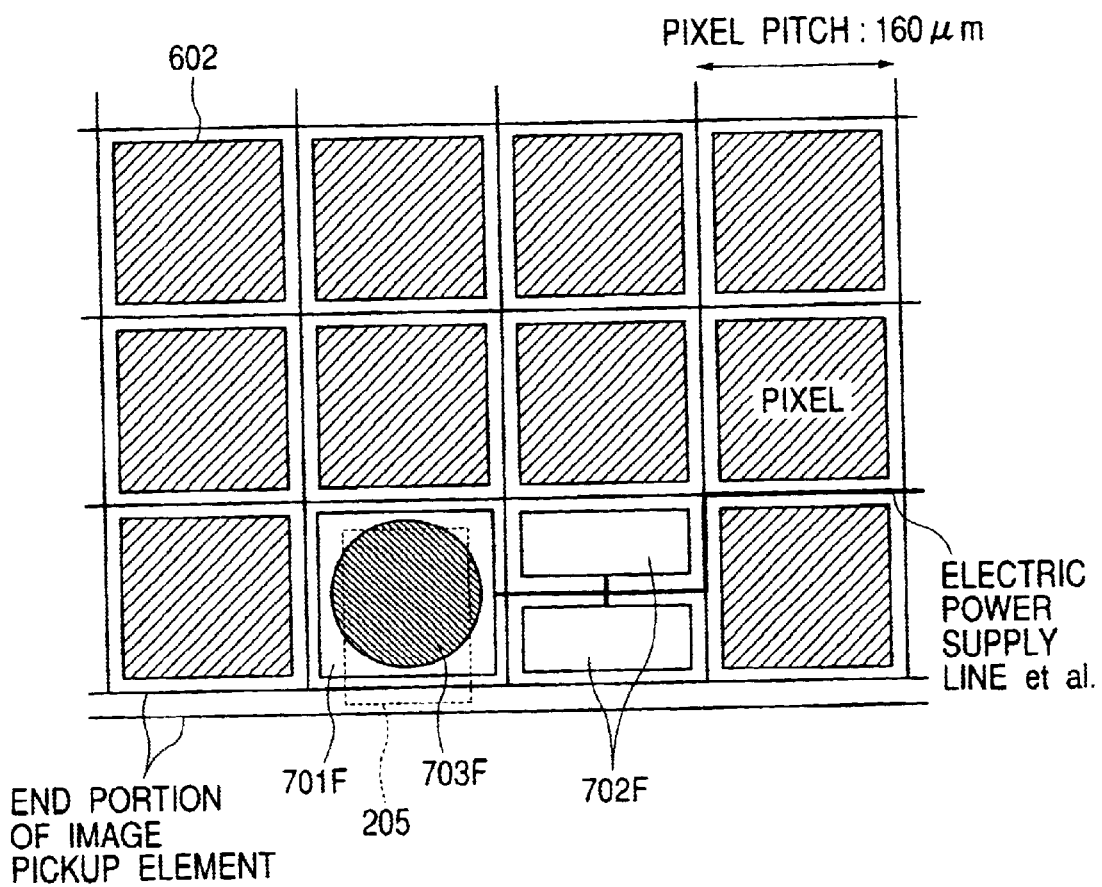
FIG. 29 is a plan view showing the layout of image pickup elements according to the thirteenth embodiment of the present invention.

In the thirteenth embodiment, as shown in FIG. 29, an external terminal 701F having a bump 703F is arranged in one pixel region, and protection circuits 702F are arranged in one pixel region adjacent to the pixel region where the external terminal 701F is arranged.

The thirteenth embodiment facilitates electrical packaging because all of a pixel region is used for a bump.

An image pickup apparatus according to the fourteenth embodiment is the same as the eighth embodiment in basic arrangement, but is different from the eighth embodiment in the layout of an external terminal and protection circuit.

Figure 30:
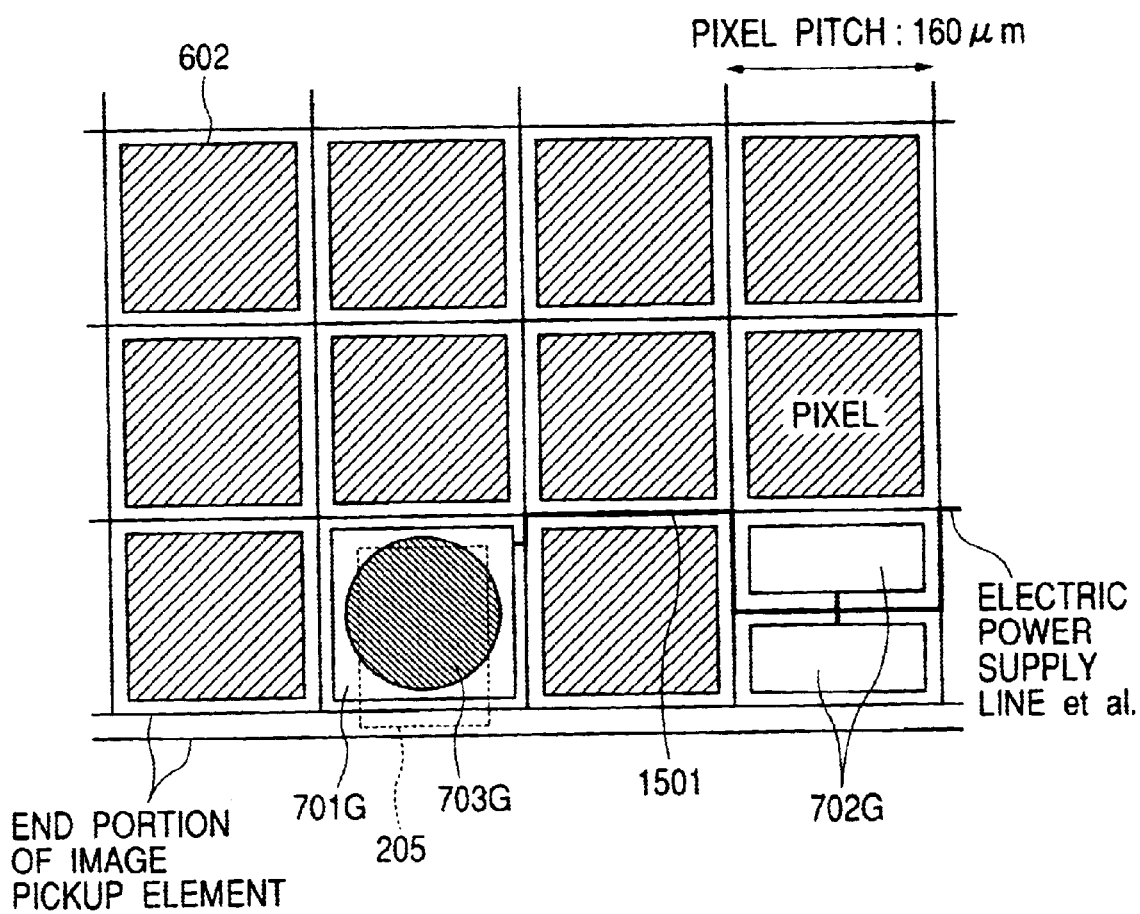
FIG. 30 is a plan view showing the layout of image pickup elements according to the fourteenth embodiment of the present invention.

In the fourteenth embodiment, as shown in FIG. 30, an external terminal 701G having a bump 703G is arranged in one pixel region, and protection circuits 702G are arranged in one pixel region apart from the pixel region where the external terminal 701G is arranged.

Alternatively, the protection circuit 702G may be replaced with a protection diode, and a wiring line 1501 may be used as a protection resistor. This can increase the resistance value of the protection resistor.

The fourteenth embodiment can improve the image quality because defective pixels exist apart from each other.

The fifteenth embodiment can be applied to the eighth to fourteenth embodiments.

Figure 31:
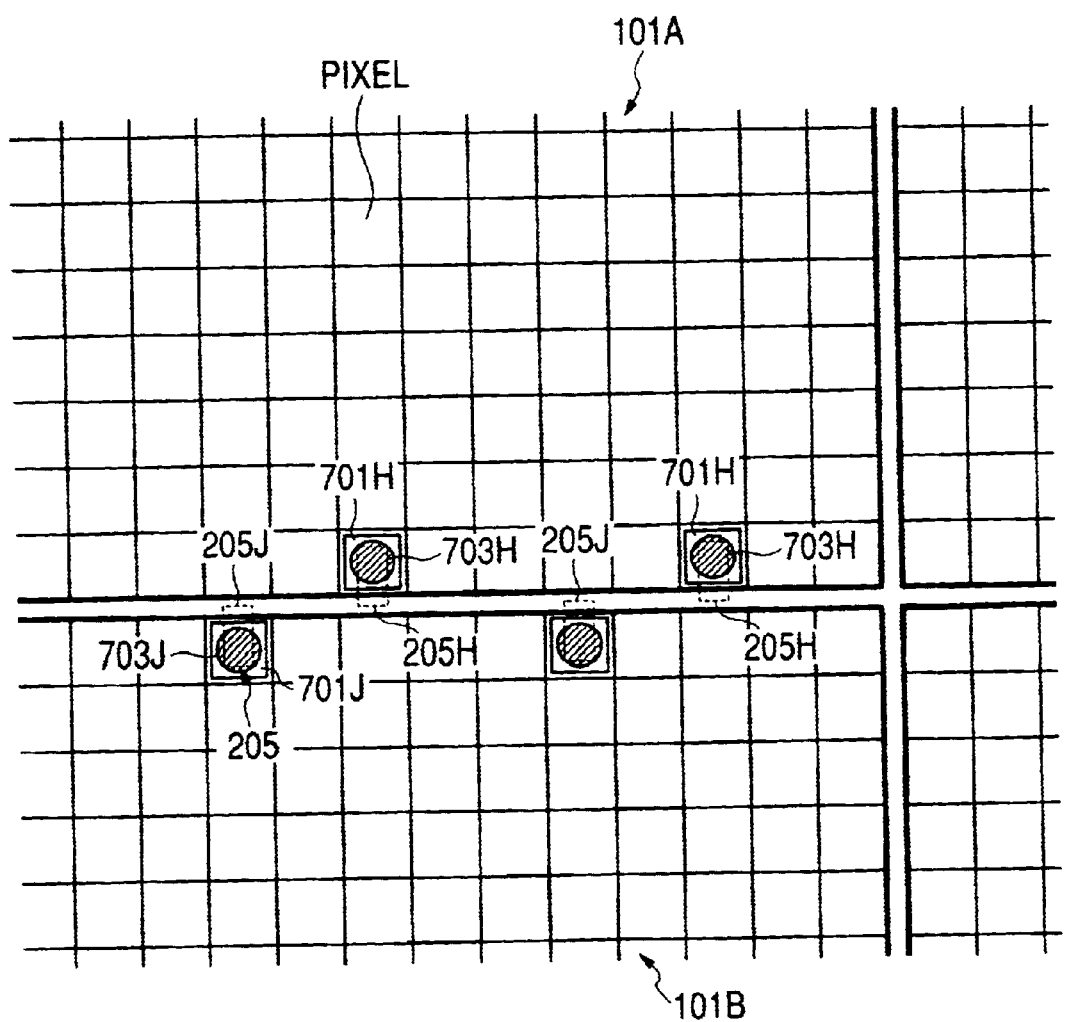
FIG. 31 is a plan view showing the layout of image pickup elements according to the fifteenth embodiment of the present invention.

In the fifteenth embodiment, when image pickup elements 101A and 101B are arranged adjacent to each other, as shown in FIG. 31, an external terminal 701H having a bump 703H and an external terminal 701J having a bump 703J are shifted from each other. Alternatively, the external terminal 701H having the bump 703H and the external terminal 701J having the bump 703J are arranged so as not to exist at the same position in a direction along adjacent sides. In FIG. 31, the external terminals 701H and 701J are arranged at the peripheral portions of the image pickup elements 101A and 101B. However, the fifteenth embodiment is not limited to this, and the external terminals 701H and 701J may be arranged inside the peripheral portions of the image pickup elements 101A and 101B as far as the external terminals 701H and 701J do not exist at the same position in a direction along adjacent sides.

This arrangement can eliminate any image defect between image pickup elements because the gap between the image pickup elements 101A and 101B can be decreased without any interference between a TAB portion 205H connected to the bump 703H and a TAB portion 205H connected to the bump 703J.

As described above, according to the eighth to fifteenth embodiments, the entire surface of an image pickup element is used as an effective pixel region, and an external terminal and protection circuit are arranged in pixels within the effective pixel region. Image pickup elements can be so arrayed as not to substantially form any gap between them. Even when a given image pickup element is surrounded by other image pickup elements to constitute an image pickup apparatus for forming one image by five (for a cross-shaped region) or nine (for a rectangular region of three rows×three columns) or more image pickup elements, no image discontinuity or omission is generated between the image pickup elements.

The image pickup apparatus having the above arrangement can use not an amorphous silicon image pickup element but a single-crystal image pickup element which is difficult to increase its size, and can pick up a large or high-resolution moving picture with a high S/N ratio.

No tapered FOP need be used, which can reduce the cost of the image pickup apparatus.

Figure 32:
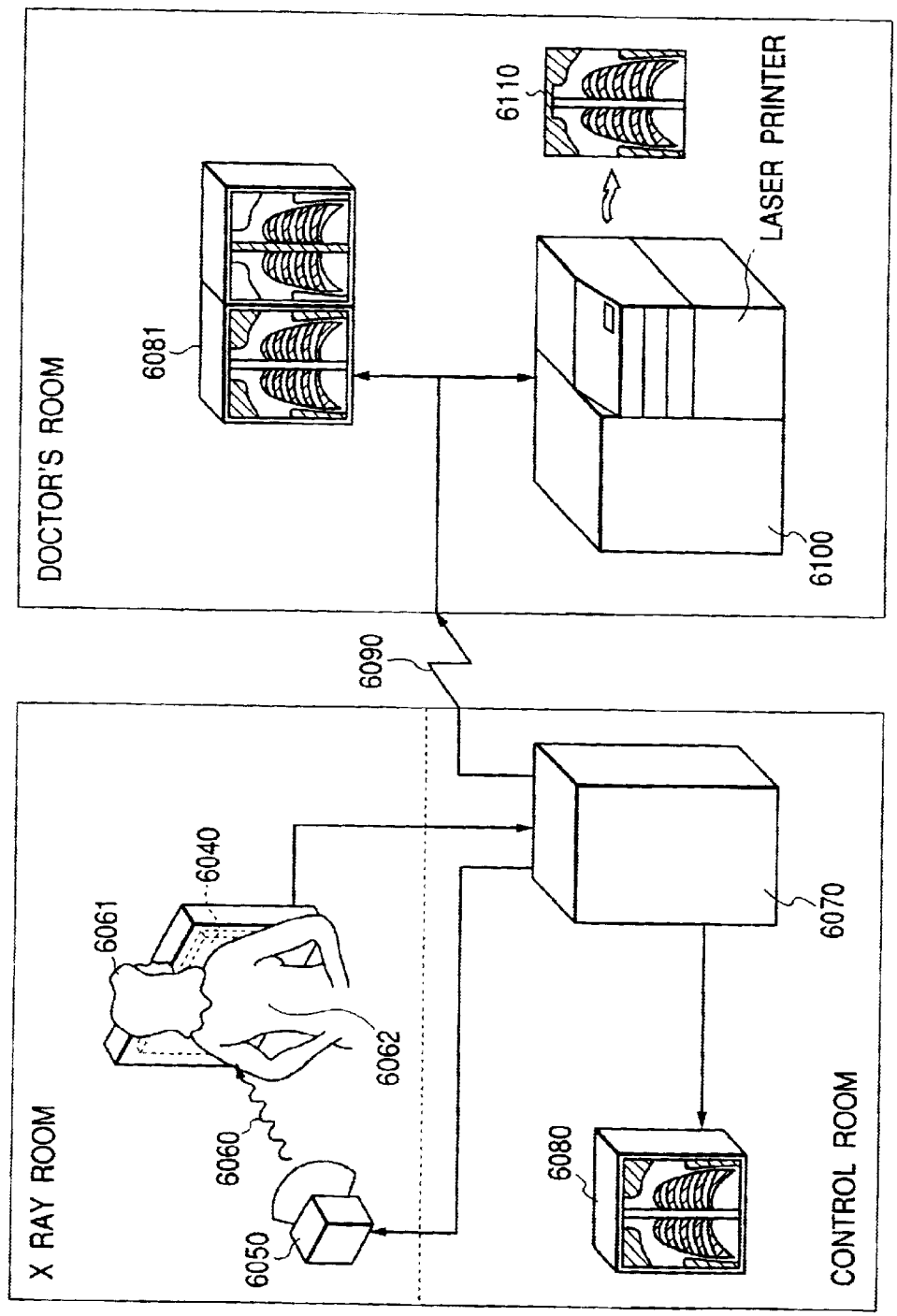
FIG. 32 is a view showing an X-ray diagnostic system according to the sixteenth embodiment of the present invention.

FIG. 32 shows an application of the image pickup apparatus described in each of the first to fifteenth embodiments to an X-ray diagnostic system.

X-rays 6060 generated by an X-ray tube 6050 pass through a chest 6062 of a patient or object 6061, and is incident onto a radiation image pickup apparatus 6040 having a scintillator 201, FOP 202, image pickup element 101, and external processing substrate 204. The incident X-rays contain information about the inside of the body of the patient 6061. The scintillator emits light correspondingly to the incident X-rays, and the image pickup element photoelectrically converts the light to obtain electrical information. The information is converted into digital data, subjected to image processing by an image processor 6070, and can be observed on a display 6080 in a control room.

This information can be transferred to a remote place via a transmission circuit such as a telephone line 6090, can be displayed on a display 6081 in a doctor's room at another place or stored in a storage circuit such as an optical disk, and can also be diagnosed by a doctor at the remote place. Further, the information can be recorded on a film 6110 by a film processor 6100.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:

a plurality of image pickup elements each of which is formed on a single semiconductor substrate, wherein each of said plurality of image pickup elements includes a plurality of pixels which include photoelectric conversion units respectively and are arranged two-dimensionally, and a scan circuit which supplies a common read-out pulse sequentially to a plurality of pixels arranged in a first direction, and wherein said scan circuit is arranged between photoelectric conversion units included in a single image pickup element and is not arranged between the photoelectric conversion units arranged respectively at end potions of image pickup elements adjacent to each other, and wherein a width of a space between the photoelectric conversion units between which said scan circuit is arranged is shorter than a pitch of each of the pixels.

2. An apparatus according to claim 1, wherein said scan circuit comprises a shift register.

3. An apparatus according to claim 2, wherein the shift register is of static type.

4. An apparatus according to claim 1, wherein said scan circuit comprises a decoder.

5. An apparatus according to claim 1, wherein said scan circuit is arranged along a plurality of photoelectric conversion units arranged in a second direction, different from the first direction.

6. An apparatus according to claim 1, wherein an electric power supply line is arranged on said scan circuit.

7. An apparatus according to claim 1, further comprising a scintillator plate and fiber optic plate provided in front of said plurality of image pickup elements.

8. An apparatus according to claim 7, further comprising:

a signal processing circuit adapted to process signals from said plurality of image pickup elements;

a recording circuit adapted to record a signal from said signal processing circuit;

a display circuit adapted to display the signal from said signal processing circuit; and a radiation source adapted to generate radiation.

9. An image pickup apparatus comprising:

a plurality of image pickup elements each of which is formed on a single semiconductor substrate.

wherein each of said plurality of image pickup elements includes a plurality of pixels which include photoelectric conversion units respectively and are arranged two-dimensionally, a plurality of first common output lines each provided to a column of photoelectric conversion units, and a plurality of transfer switches which transfer signals from said plurality of first common output lines sequentially to a second common output line, and wherein each of said plurality of transfer switches is arranged between photoelectric conversion units included in a single image pickup element and is not arranged between photoelectric conversion units arranged respectively at end portions of image pickup elements adjacent to each other.

10. An apparatus according to claim 9, wherein an electric power supply line is arranged on said plurality of transfer switches.

11. An apparatus according to claim 9, further comprising a scintillator plate and fiber optic plate provided in front of said plurality of image pickup elements.-

12. An apparatus according to claim 11, further comprising:
  a signal processing circuit adapted to process signals from said plurality of image pickup elements;
  a recording circuit adapted to record a signal from said signal processing circuit;
  a display circuit adapted to display the signal from said signal processing circuit; and
  a radiation source adapted to generate radiation.

13. An image pickup apparatus comprising:
  a plurality of image pickup elements each of which is formed on a single semiconductor substrate,
  wherein each of said plurality of image pickup elements includes a plurality of pixels which include photoelectric conversion units respectively and are arranged two-dimensionally, and a protection circuit, and
  wherein said protection circuit is arranged between photoelectric conversion units included in a single image pickup element and is not arranged between photoelectric conversion units arranged respectively at end portions of image pickup elements adjacent to each other.

14. An apparatus according to claim 13, wherein said protection circuit comprises a protection resistor.

15. An apparatus according to claim 13, wherein said protection circuit comprises a protection diode.

16. An apparatus according to claim 13, further comprising a scintillator plate and a fiber optic plate.

17. An apparatus according to claim 16, further comprising:
  a signal processing circuit adapted to process a signal from said image pickup region;
  a recording circuit adapted to record a signal from said signal processing circuit;
  a display circuit adapted to display the signal from said signal processing circuit; and a radiation source adapted to generate radiation.

18. An image pickup apparatus for dividing an object image into a plurality of regions to form one image, wherein external terminals which are connected to a wiring line sandwiched between boundary sides of first and second regions and are arranged in the first region, are not at the same positions in a direction along the boundary sides as external terminals which are connected to another wiring line sandwiched between the boundary sides and are arranged in the second region.

19. An apparatus according to claim 18, further comprising a scintillator plate and a fiber optic plate.

20. An apparatus according to claim 19, further comprising:
  a signal processing circuit adapted to process a signal from said image pickup region;
  a recording circuit adapted to record a signal from said signal processing circuit;
  a display circuit adapted to display the signal from said signal processing circuit; and
  a radiation source adapted to generate radiation.

21. An image pickup apparatus comprising:
  a plurality of image pickup elements each of which is formed on a single semiconductor substrate,
  wherein each of said plurality of image pickup elements includes a plurality of pixels which include photoelectric conversion units respectively and are arranged two-dimensionally, a plurality of first common output lines each provided to a column of photoelectric conversion units, a plurality of transfer switches which transfer signals from said plurality of first common output lines sequentially to a second common output line, and a scan circuit which supplies pulses sequentially to said plurality of transfer switches, and
  wherein said scan circuit is arranged between photoelectric conversion units included in a single image pickup element and is not arranged between photoelectric conversion units arranged respectively at end portions of image pickup elements adjacent to each other, and
  wherein a width of a space between the photoelectric conversion units between which said scan circuit is arranged is shorter than a pitch of each of the pixels.

22. An apparatus according to claim 21, further comprising a scintillator plate and fiber optic plate, provided in front of said plurality of image pickup elements.

23. An apparatus according to claim 22, further comprising:
  a signal processing circuit adapted to process signals from said plurality of image pickup elements;
  a recording circuit adapted to record a signal from said signal processing circuit;
  a display circuit adapted to display the signal from said signal processing circuit; and
  a radiation source adapted to generate radiation.

24. An apparatus according to claim 21, wherein said scan circuit comprises a shift register.

25. An apparatus according to claim 24, wherein the shift resister is of static type.

26. An apparatus according to claim 21, wherein said scan circuit comprises a decoder.

27. An image pickup apparatus comprising:
  a plurality of image pickup elements each of which is formed on a single semiconductor substrate,
  wherein each of said plurality of image pickup elements includes a plurality of pixels which include photoelectric conversion units respectively and are arranged two-dimensionally, a vertical scan circuit which supplies a common read-out pulse to the pixels arranged in one direction, a plurality of first common output lines each provided to a column of photoelectric conversion units, a plurality of transfer switches which transfer signals from said plurality of first common output lines sequentially to a second common output line, and a horizontal scan circuit which supplies pulses sequentially to said plurality of transfer switches,
  wherein said vertical scan circuit is arranged between photoelectric conversion units included in a single image pickup element, and said horizontal scan circuit is arranged between photoelectric conversion units included in the single image pickup element, and neither said vertical scan circuit or said horizontal scan circuit are arranged between the photoelectric conversion units arranged respectively at end portions of image pickup elements adjacent to each other, and
  wherein a width of a space between the photoelectric conversion units between which said vertical scan circuit is arranged, and a width of a space between the photoelectric conversion units between which said horizontal scan circuit is arranged is shorter than a pitch of each of the pixels.

28. An apparatus according to claim 27, wherein said vertical scan circuit is bent so as not to cross the horizontal scan circuit.

29. An apparatus according to claim 27, wherein said horizontal scan circuit is bent so as not to cross the vertical scan circuit.

30. An apparatus according to claim 27, further comprising a scintillator plate and fiber optic plate, provided in front of said plurality of image pickup elements.-

31. An apparatus according to claim 30, further comprising:
a signal processing circuit adapted to process signals from said plurality of image pickup elements;
a recording circuit adapted to record a signal from said signal processing circuit;
a display circuit adapted to display the signal from said signal processing circuit; and
a radiation source adapted to generate radiation.

32. An image pickup apparatus comprising:
a plurality of image pickup elements each of which is formed on a single semiconductor substrate,
wherein each of said plurality of image pickup elements includes a plurality of pixels which include photoelectric conversion units respectively and are arranged two-dimensionally, and an external terminal, and
wherein said external terminal is arranged between photoelectric conversion units included in a single image pickup element and is not arranged between photoelectric conversion units arranged respectively at end portions of image pickup elements adjacent to each other.

33. An apparatus according to claim 32, wherein said external terminal has a bump.

34. An apparatus according to claim 32, further comprising a scintillator plate and fiber optic plate, provided in front of said plurality of image pickup elements.

35. An apparatus according to claim 34, further comprising:
a signal processing circuit adapted to process signals from said plurality of image pickup elements;
a recording circuit adapted to record a signal from said signal processing circuit;
a display circuit adapted to display the signal from said signal processing circuit; and
a radiation source adapted to generate radiation.

36. An image pickup apparatus comprising:
a plurality of image pickup elements each of which is formed on a single semiconductor substrate,
wherein each of said plurality of image pickup elements includes a plurality of pixels which include photoelectric conversion units respectively and are arranged two-dimensionally, a protection circuit and an external terminal, and
wherein said protection circuit and said external terminal are arranged between photoelectric conversion units included in a single image pickup element and are not arranged between photoelectric conversion units arranged respectively at end portions of image pickup elements adjacent to each other, and wherein a width of a space between the photoelectric conversion units between which said protection circuit and said external terminal are arranged is shorter than a pitch of each of the pixels.

37. An apparatus according to claim 36, wherein said external terminal and said protection circuit are arranged side by side.

38. An apparatus according to claim 36, wherein said external terminal and said protection circuit overlap each other.

39. An apparatus according to claim 36, wherein a protection resistor is interposed between said external terminal and said protection circuit.

40. An apparatus according to claim 36, further comprising a scintillator plate and a fiber optic plate, provided in front of said plurality of image pickup elements.

41. An apparatus according to claim 40, further comprising:
a signal processing circuit adapted to process signals from said plurality of image pickup elements;
a recording circuit adapted to record a signal from said signal processing circuit;
a display circuit adapted to display the signal from said signal processing circuit; and
a radiation source adapted to generate radiation.

42. An image pickup apparatus comprising:
a plurality of image pickup elements each of which is formed on a single semiconductor substrate,
wherein each of said plurality of image pickup elements includes a plurality of pixels which include respective photoelectric conversion units and are arranged two-dimensionally in horizontal and vertical directions, and a scan circuit which supplies, sequentially in the vertical direction, a read-out pulse common to a plurality of pixels arranged in a horizontal direction,
wherein said scan circuit includes first and second partial scanning circuits, and
wherein said first and second partial scanning circuits are each arranged between photoelectric conversion units arranged in the vertical direction included in a single image pickup element, and between photoelectric conversion units arranged in the horizontal direction included in the single image pickup element, and are not arranged between photoelectric conversion units arranged respectively at end portions of image pickup elements adjacent to each other.

43. An apparatus according to claim 42, further comprising:
a signal processing circuit adapted to process signals from said plurality of image pickup elements;
a recording circuit adapted to record a signal from said signal processing circuit;
a display circuit adapted to display the signal from said signal processing circuit; and
a radiation source adapted to generate radiation.

44. An image sensing apparatus for sensing a radiation image, comprising:
a plurality of image pickup elements each of which is formed on a single semiconductor substrate,
wherein each of said plurality of image pickup elements includes a plurality of pixels which include respective photoelectric conversion units and are arranged two-dimensionally in horizontal and vertical directions, and a scan circuit which supplies, sequentially in the vertical direction, a read-out pulse common to a plurality of pixels arranged in the horizontal direction, and
wherein said scan circuit includes a shift register of a static type, is arranged between photoelectric conversion units included in a single image pickup element, and is not arranged between photoelectric conversion units arranged respectively at end portions of image pickup elements adjacent to each other.

45. An apparatus according to claim 44, wherein the radiation image includes an X-ray image.

46. An apparatus according to claim 44, further comprising:
a single processing circuit adapted to process signals from said plurality of image pickup elements;
a recording circuit adapted to record a signal from said signal processing circuit;
a display circuit adapted to display the signal from said signal processing circuit; and
a radiation source adapted to generate radiation.

* * * * *

UNITED STATES PATENT AND TRADEMARK OFFICE
CERTIFICATE OF CORRECTION

PATENT NO.   : 6,717,151 B2
DATED        : April 6, 2004
INVENTOR(S)  : Kazuaki Tashiro et al.

It is certified that error appears in the above-identified patent and that said Letters Patent is hereby corrected as shown below:

<u>Column 14,</u>
Line 45, "substrate." should read -- substrate, --; and
Line 67, "elements.-" should read -- elements. --.

<u>Column 15,</u>
Line 35, "and a" should read -- and ¶ a --.

<u>Column 16,</u>
Line 67, "elements.-" should read -- elements. --.

Signed and Sealed this

Seventeenth Day of May, 2005

JON W. DUDAS
*Director of the United States Patent and Trademark Office*